(12) United States Patent
Miyamoto et al.

(10) Patent No.: US 11,172,573 B2
(45) Date of Patent: Nov. 9, 2021

(54) POWER SUPPLY DEVICE

(71) Applicant: Mitsubishi Electric Corporation, Chiyoda-ku (JP)

(72) Inventors: Takashi Miyamoto, Chiyoda-ku (JP); Naoki Yasuda, Chiyoda-ku (JP); Shinichi Okada, Chiyoda-ku (JP); Hiroyuki Osuga, Chiyoda-ku (JP); Ryota Kusano, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 152 days.

(21) Appl. No.: 16/348,776

(22) PCT Filed: Dec. 28, 2017

(86) PCT No.: PCT/JP2017/047296
§ 371 (c)(1),
(2) Date: May 9, 2019

(87) PCT Pub. No.: WO2018/124288
PCT Pub. Date: Jul. 5, 2018

(65) Prior Publication Data
US 2020/0060023 A1    Feb. 20, 2020

(30) Foreign Application Priority Data
Dec. 28, 2016  (JP) .............................. JP2016-255381

(51) Int. Cl.
*H05K 1/14*      (2006.01)
*H05K 7/20*      (2006.01)
(52) U.S. Cl.
CPC ................ *H05K 1/14* (2013.01); *H05K 7/20* (2013.01)

(58) Field of Classification Search
CPC ............. H05K 7/2039; H05K 7/20409; H05K 7/20418; H05K 7/20445; H05K 7/205;
(Continued)

(56) References Cited

U.S. PATENT DOCUMENTS 4,396,936 A    8/1983   McIver et al.
4,460,917 A    7/1984   Rogers
(Continued)

FOREIGN PATENT DOCUMENTS

DE    103 00 175 A1    7/2004
EP    2 373 143 A2    10/2011
(Continued)

OTHER PUBLICATIONS

International Search Report dated Apr. 3, 2018 in PCT/JP2017/047296 filed Dec. 28, 2017.
(Continued)

*Primary Examiner* — Roshn K Varghese
(74) *Attorney, Agent, or Firm* — Oblon, McClelland, Maier & Neustadt, L.L.P.

(57) ABSTRACT

A power supply device (100-1) includes: a substrate (20) on which an electric component (25) is mounted; a chassis (10) including a chassis surface (11) to be a surface facing one surface (20a) of the substrate (20); and cured insulating resin (27-1) to be placed between the one surface (20a) of the substrate (20) and the chassis surface (11) so as to be connected to the one surface (20a) and the chassis surface (11), the cured insulating resin (27-1) having a thermal conductivity between 1 W/mK and 10 W/mK inclusive.

5 Claims, 21 Drawing Sheets

(58) Field of Classification Search
CPC ........... H05K 7/20509; H05K 7/20545; H05K 7/20472; H05K 7/20481; H05K 5/006; H05K 1/0201; H05K 1/0203; H05K 1/0204; H05K 1/14; H05K 1/02; H05K 7/20; H01L 2224/48227; H01L 2224/32245; H01L 23/3121; H01L 23/3677

See application file for complete search history.

(56) References Cited

U.S. PATENT DOCUMENTS

| | | | |
|---|---|---|---|
| 5,923,084 | A | 7/1999 | Inoue et al. |
| 6,347,038 | B1 | 2/2002 | Duarte et al. |
| 6,707,671 | B2 * | 3/2004 | Yamashita .......... H01L 23/3737 257/687 |
| 2003/0184969 | A1 | 10/2003 | Itabashi et al. |
| 2004/0042180 | A1 | 3/2004 | Yamaguchi |
| 2004/0233640 | A1 | 11/2004 | Itabashi et al. |
| 2005/0064707 | A1 | 3/2005 | Sinha |
| 2007/0027254 | A1 | 2/2007 | Kawata et al. |
| 2007/0166991 | A1 | 7/2007 | Sinha |
| 2007/0170595 | A1 | 7/2007 | Sinha |
| 2009/0195991 | A1 | 8/2009 | Suzaki |
| 2010/0091464 | A1 | 4/2010 | Ohnishi et al. |
| 2010/0124024 | A1 | 5/2010 | Nishiuma et al. |
| 2010/0127370 | A1 | 5/2010 | Ozawa et al. |
| 2010/0127371 | A1 | 5/2010 | Tschirbs |
| 2010/0133661 | A1 | 6/2010 | Sinha |
| 2011/0199732 | A1 | 8/2011 | Nishiuma et al. |
| 2012/0156871 | A1 | 6/2012 | Sinha |
| 2012/0236505 | A1 | 9/2012 | Nishiuma et al. |
| 2013/0003306 | A1 * | 1/2013 | Oota .................. H01L 23/4006 361/709 |
| 2016/0295740 | A1 | 10/2016 | Shibata |

FOREIGN PATENT DOCUMENTS

| | | |
|---|---|---|
| EP | 2 373 143 A3 | 10/2011 |
| JP | S57-134953 | 8/1982 |
| JP | S61-179754 | 11/1986 |
| JP | S62-190356 | 12/1987 |
| JP | H02-220495 | 9/1990 |
| JP | 4-111493 A | 4/1992 |
| JP | 4-113695 A | 4/1992 |
| JP | 5-160289 A | 6/1993 |
| JP | 5-259669 A | 10/1993 |
| JP | 7-162177 A | 6/1995 |
| JP | 9-55459 A | 2/1997 |
| JP | 9-130049 A | 5/1997 |
| JP | H09-283949 | 10/1997 |
| JP | 10-284654 A | 10/1998 |
| JP | 2000-332171 A | 11/2000 |
| JP | 2003-289191 A | 10/2003 |
| JP | 2003-291898 | 10/2003 |
| JP | 2004-95586 A | 3/2004 |
| JP | 2004-158545 A | 6/2004 |
| JP | 2005-5695 A | 1/2005 |
| JP | 2005-64168 A | 3/2005 |
| JP | 2005-158985 A | 6/2005 |
| JP | 2005-333077 A | 12/2005 |
| JP | 2007-19125 A | 1/2007 |
| JP | 2007-520051 A | 7/2007 |
| JP | 2008-277330 A | 11/2008 |
| JP | 2009-11518 | 1/2009 |
| JP | 2009-188182 | 8/2009 |
| JP | 2010-123787 A | 6/2010 |
| JP | 2010-218688 A | 9/2010 |
| JP | 2011-187729 A | 9/2011 |
| JP | 5093563 | 9/2012 |
| JP | 2013-258330 A | 12/2013 |
| JP | 2014-36033 | 2/2014 |
| JP | 2014-53618 A | 3/2014 |
| JP | 2015-21118 A | 2/2015 |
| JP | 2015-207729 A | 11/2015 |
| JP | 2016-171288 A | 9/2016 |
| WO | WO 03/098987 A1 | 11/2003 |
| WO | WO 2009/069308 A1 | 6/2009 |
| WO | WO 2015/076050 A1 | 5/2015 |

OTHER PUBLICATIONS

Japanese Office Action dated Mar. 5, 2019 in Japanese Patent Application No. 2018-559639 (with unedited computer-generated English translation).

Bussarakons, T., "New Materials and Technologies Solve Hermetic SMD Integration," PCIM Power Electronic Systems Magazine, www.irf.com/technicai-info/whitepaper/hermsmd.pdf, Dec. 2019, 5 pages.

U.S. Appl. No. 17/254,313, filed Dec. 21, 2020, Takashi Miyamoto.

International Search Report issued in PCT/JP2018/024445 dated Sep. 18, 2018 with concise English translation.

Product Brochure—IR HiRel—An Infineon Technologies Company—HFA45HC120C (IR HiRel) HEXFRED Ultrafast, Soft Recovery Diode dated Jan. 3, 2017.

Product Brochure—IR HiRel—An Infineon Technologies Company—IRHMS67260 (IR HiRel) Radiation Hardened Power Mosfet Thru-Hole (Low-Ohmic TO-254AA) dated Jan. 30, 2017.

Extended European Search Report dated Mar. 26, 2020 in European Patent Application No. 17 887 800.5, 35 pages.

Extended European Search Report dated Jun. 25, 2021 in European Patent Application No. 18924944.4, 11 pages.

The partial Supplementary European Search Report dated Dec. 2, 2019 in European Patent Application No. 17887800.5, 13 pages.

* cited by examiner

POWER SUPPLY DEVICE

TECHNICAL FIELD

The present invention relates to a space power supply having a structure with high heat dissipation that allows mounting of high-heat-generating components even with use of conventional substrates such as polyimide substrates or glass epoxy substrates.

BACKGROUND ART

Performance and a life of an electric component depend on heat generation from or an ambient temperature of the electric component. Particularly, electric components that are used in a vacuum are incapable of heat transfer through a medium of air or heat radiation into air because there is no air for cooling around the electric components, in contrast to on the ground. For a space power supply, therefore, design for heat dissipation from substrates to a chassis is important.

In recent years, additionally, increase in power of artificial satellites has involved increase in power consumption by equipment installed in the artificial satellites and thus has made technology of the design for the beat dissipation important. Particularly, FET (Field Effect Transistor) and diodes for use in switching power supplies are high-heat-generating electric components. In a conventional measure for the heat dissipation, such high-heat-generating electric components are mounted in positions on substrates that are near to screws for fixation to a chassis. Alternatively, such high-beat-generating electric components are directly installed on the chassis and are electrically connected to patterns on the substrates with contrivance in lead bending or contrivance in extension of interconnections to the substrates.

CITATION LIST

Patent Literature

Patent Literature 1: JP 2014-53618
Patent Literature 2: JP 2007-019125
Patent Literature 3: JP 2000-332171
Patent Literature 4: WO 2015/076,050 pamphlet

Non-Patent Literature

Non-Patent Literature 1: www.irf.com/technical-info/white-paper/hermsmd.pdf "New Materials and Technologies Solve Hermetic SMD Integration" [Searched on Dec. 27, 2016]

SUMMARY OF INVENTION

Technical Problem

Such installation methods as mentioned above, however, have problems of increase in or loss of an inductance component due to elongation of interconnection paths, influences of EMC (Electromagnetic Compatibility), and increase in working processes during mounting.

Furthermore, there is a necessity for measures of increase in a number of the screws for connection between the substrates and the chassis and placement of the heat-generating components in positions that are as near as possible to the screws for promotion of the heat dissipation and reduction in heat generation density through distribution with use of a large number of components. Consequently, a problem of increase in sizes and mass of the power supplies has existed.

The present invention mainly aims at providing a simply-configured heat dissipation structure in a power supply device that prevents elongation of interconnection paths for heat-generating components and that obviates necessity to increase a number of screws for connection between substrates and a chassis.

Solution to Problem

A power supply device according to an embodiment of the present invention including:
a substrate on which an electric component is mounted;
a chassis including a chassis surface to be a surface facing one surface of the substrate; and
a chassis-side resin part to be a cured insulating resin to be placed between the one surface of the substrate and the chassis surface so as to be connected to the one surface and the chassis surface, the cured insulating resin having a thermal conductivity between 1 W/mK and 10 W/mK inclusive.

Advantageous Effects of Invention

The present invention includes the chassis-side resin part and is thus capable of providing the power supply device having the simply-configured heat dissipation structure.

DESCRIPTION OF EMBODIMENTS

Figure 1:
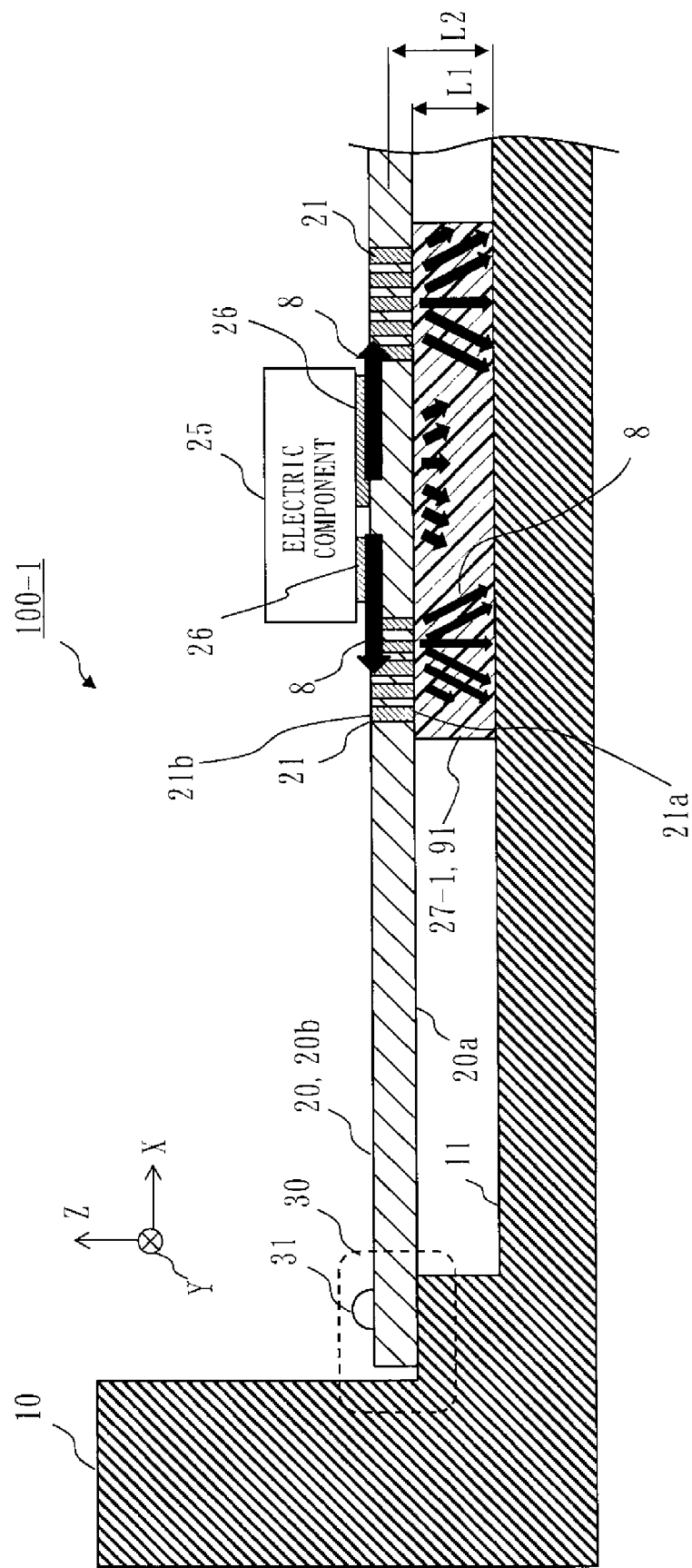
FIG. 1 is a diagram illustrating Embodiment 1 and a sectional view of a power supply device.

Hereinbelow, embodiments of the present invention will be described with use of the drawings. In the drawings, identical parts or corresponding parts are provided with identical reference characters. In description on the embodiments, description on the identical parts or the corresponding parts are omitted or simplified appropriately. As Embodiments 1 to 8, space power supply devices 100 having different configurations will be described. Hereinbelow, the space power supply devices 100 will be referred to as power supply devices 100.

The power supply devices 100 may have one of the configurations of Embodiments 1 to 8 or may have a plurality of configurations among the configurations of Embodiments 1 to 8.

In the embodiments below, the power supply devices 100 are distinguished by addition of "-1" as in a power supply device 100-1, for instance.

Embodiment 1

DESCRIPTION OF CONFIGURATION

Figure 2:
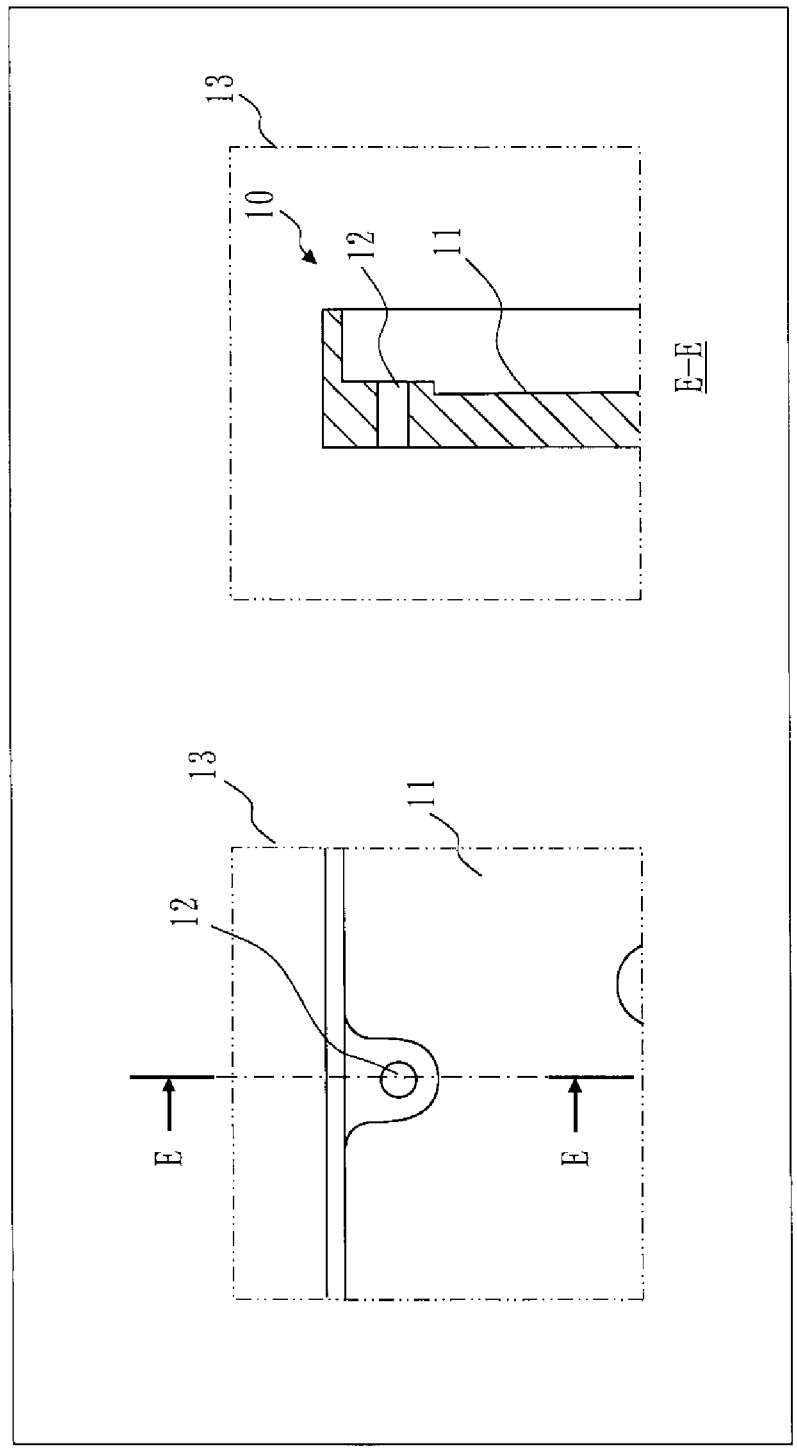
FIG. 2 is diagrams illustrating Embodiment 1 and a partial plan view and an E-E sectional view of a chassis.
Figure 3:
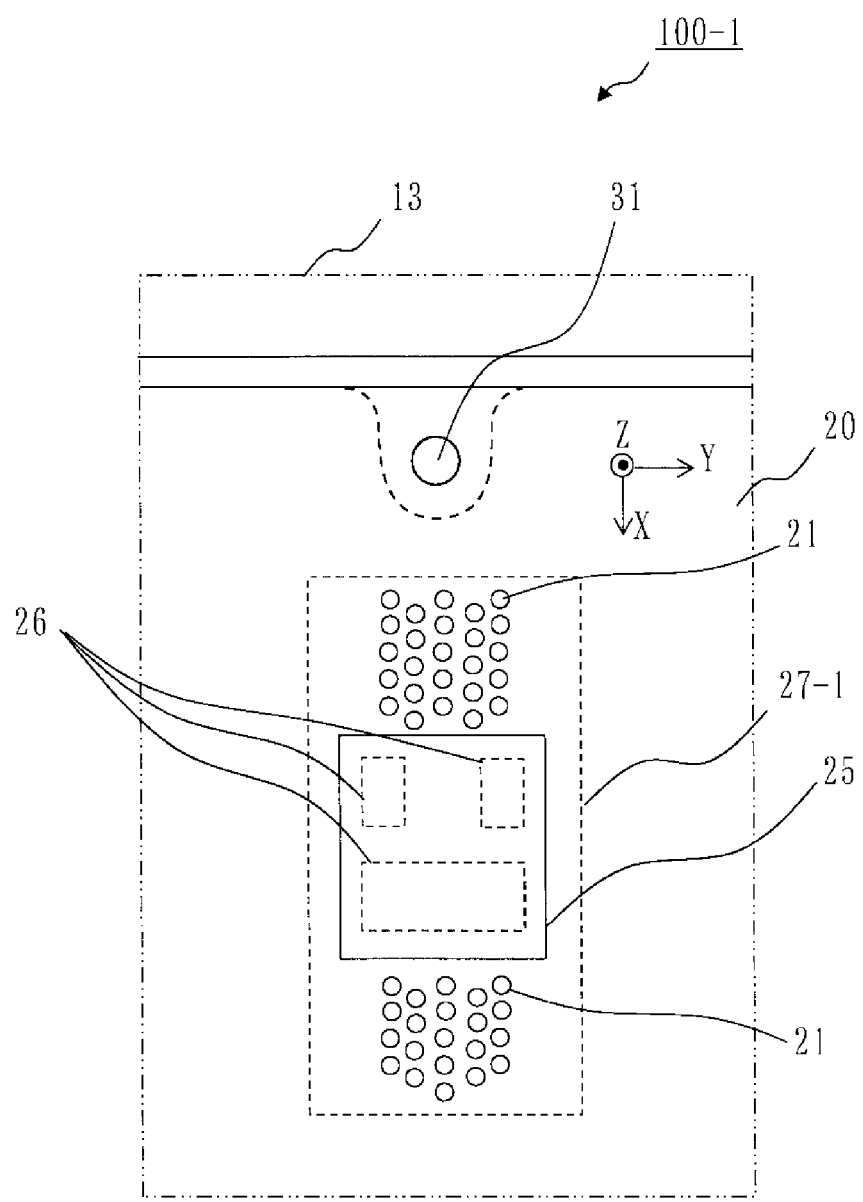
FIG. 3 is a diagram illustrating Embodiment 1 and schematically illustrating a plan view of the power supply device.

With reference to FIGS. 1 to 3, the power supply device 100-1 of Embodiment 1 will be described. The power supply device 100-1 may be used in a vacuum or a near-vacuum environment on the ground.

FIG. 1 is a sectional view of the power supply device 100-1. Therein, an electric component 25 and a screw are not illustrated in sections. In FIG. 1, xyz coordinate system is illustrated. The same coordinate system is illustrated for Embodiments 2 to 9. FIGS. 4 and 6 to 14 that are sectional views of Embodiments 2 to 9 illustrate sections of the same site as is illustrated in FIG. 1.

The power supply device 100-1 includes a chassis 10, a substrate 20 on which the electric component 25 is mounted and which is fixed to the chassis 10, and a fixation part 30 to fix the substrate 20 to the chassis 10. In the power supply device 100-1, the fixation part 30 is a substrate fixation screw 31.

FIG. 2 illustrates a partial plan view (view in an arrow direction –Z in FIG. 1) and an E-E section of the chassis 10. The E-E section corresponds to FIGS. 1, 4, 6 to 16, and 21. The substrate fixation screw 31 is screwed into a screw hole 12. In FIG. 1, a portion of the chassis 10 and a portion of the substrate 20 are illustrated. A plurality of screw holes 12 exist on the chassis 10. The substrate fixation screw 31 is screwed into each of the screw holes 12. A plurality of substrate fixation screws 31 and the plurality of screw holes 12 are placed on a peripheral edge part along a perimeter of the substrate 20 and are provided at specified intervals in four corners or on four sides of a rectangle, for instance.

FIG. 3 is a diagram schematically illustrating a view of a portion corresponding to an area 13 in FIG. 2, that is, FIG. 1 in the arrow direction –Z.

In the power supply device 100-1 of FIG. 1, the substrate 20 on which the electric component 25 is mounted is fixed to the chassis 10. Electrodes 26 of the electric component 25 are connected to a C surface of the substrate 20 that is the other surface 20b on a back side of one surface 20a. Filled through-holes 21 to be described later are formed on the substrate 20. In FIG. 1, the filled through-holes 21 numbering in ten are illustrated. Heat 8 represented by arrows and generated in the electric component 25 is conducted from the filled through-holes 21 via cured insulating resin 27-1 to be described later to a chassis surface 11.

Thus the power supply device 100-1 includes the substrate 20, the chassis 10, and the cured insulating resin 27-1 that is a chassis-side resin part 91 and the electric component 25 is mounted on the substrate 20. The chassis 10 includes the chassis surface 11 that is a surface facing the one surface 20a of the substrate 20. The cured insulating resin 27-1 is placed between the one surface 20a of the substrate 20 and the chassis surface 11. The cured insulating resin 27-1 is cured insulating resin connected to the one surface 20a and the chassis surface 11 and having a thermal conductivity between 1 W/mK and 10 W/mK inclusive.

(Substrate 20)

The electric component 25 that generates a large quantity of heat is installed on the substrate 20. In the embodiment, an FET of SMD (Surface Mount Device) type is used as the electric component 25 that generates the large quantity of heat. Ordinarily, heat generated in an FET of SMD type is conducted from electrodes of the FET to a circuit pattern on the substrate 20, then conducted in in-plane directions, and conducted through screw fastening parts to the chassis 10.

(Filled Through-Hole)

In the power supply device 100-1, potting (molding) between an S surface that is the one surface 20a of the substrate 20 and the chassis surface 11 of the chassis 10 is attained with use of a highly thermal conductive insulating resin composition (uncured insulating resin 27-1) as illustrated in FIG. 1. Thus the heat of the electric component 25 is conducted to the chassis 10 through highly thermal conductive potting resin that is the insulating resin composition, as paths. The through-holes penetrating from the C surface to the S surface of the substrate 20 are provided in order to improve thermal conduction in a thickness direction (from the C surface that is the other surface 20b to the S surface) in the substrate 20. The through-holes are plated. Inside of the plated through-holes is filled with solder, another metal, or potting resin having high thermal conductivity. The through-holes are referred to as the filled through-holes 21.

Thus the substrate 20 includes the filled through-holes 21 in which the through-holes formed through the substrate 20, from the one surface 20a to the other surface 20b, are filled with a heat transfer material. The cured insulating resin 27-1 is connected to one end part 21a of each of the filled through-holes 21 that appears on the one surface 20a. The heat transfer material that fills the filled through-holes 21 is metal, cured insulating resin having the thermal conductivity between 1 W/mK and 10 W/mK inclusive, or the like.

Subsequently, characteristics of the cured insulating resin 27-1 and the insulating liquid resin composition from which the cured insulating resin 27-1 is made will be described. For the cured insulating resin 27-1, silicone or urethane is used as a base resin, though details will be described below. The cured insulating resin 27-1 contains at least one of alumina, boron nitride, aluminum nitride, magnesium oxide, and beryllium oxide, as an inorganic filler, and has a Shore A hardness of 70 or less, a low-molecular component volatilization volume of 1,000 ppm or less with 300° C. heating, and a glass transition point of −20° C. or lower.

Examples of methods of forming the highly thermal conductive cured insulating resin 27-1 between the S surface of the substrate 20 and the chassis 10 include methods (1) and (2) below.

(1) There is the formation method in which the substrate 20 is fixed to the chassis 10, thereafter the insulating liquid resin composition is poured into between the chassis 10 and the substrate 20, and the insulating resin composition is cured by heat.

(2) Alternatively, the cured insulating resin 27-1 is formed on a bottom surface of the chassis 10 and the substrate 20 is thereafter fixed to the chassis 10 by the substrate fixation screw 31. In the method (2), a thickness L2 of the cured insulating resin 27-1 at time before installation of the substrate 20 on the chassis 10 is formed so as to be in a range between 110% and 250% inclusive of a width L1 between the S surface (the one surface 20a) of the substrate 20 and the chassis surface 11 of the chassis 10, depending on the hardness of the cured insulating resin 27-1.
That is, $$L2=(1.1 \text{ to } 2.5) \times L1$$

holds. More preferably, the thickness L2 of the cured insulating resin 27-1 at time before the installation of the substrate 20 on the chassis 10 is in a range between 120% and 200% inclusive of the width L1.
That is, $$L2=(1.2 \text{ to } 2.0) \times L1$$

holds. On condition that the thickness L2 of the cured insulating resin 27-1 is formed in the range, an interface between the S surface and the cured insulating resin 27-1 is brought into more tight and intimate contact by the fixation part 30 for the substrate 20, so that an effect of the heat dissipation may be enhanced. Furthermore, deterioration of the heat dissipation in case of decrease in the thickness due to cooling-heating cycles in a usage environment may be reduced. On condition that the thickness of the cured insulating resin 27-1 is smaller than 110% of the width between the S surface and the chassis surface 11, that is, on condition that $$L2<1.1 \times L1$$

holds, the effect of the heat dissipation is deteriorated by the decrease in the thickness of the cured insulating resin 27-1 due to the cooling-heating cycles.

On condition that the thickness L2 exceeds 200% of the thickness L1, that is, on condition that $$L2>2.0 \times L1$$

holds, there is a fear that the substrate 20 may be deformed when the substrate 20 is fixed to the chassis 10 by the screws and that the substrate 20 may be cracked in the cooling-heating cycles because of such deformation.

In the above methods (1) and (2), the cured insulating resin 27-1 may be formed by pouring of the insulating liquid resin composition with the S surface of the substrate 20 directed upward (in +Z direction). In this process as well, the thickness L2 of the cured insulating resin is made as large as the thickness described in relation to the above method (2).

Subsequently, the substrate 20 is fixed to the chassis 10 by the screws so that the cured insulating resin 27-1 having been formed comes into contact with the chassis 10. This fixation prevents bubbles to be insulation weak points from remaining on high-voltage sites such as interconnection pattern on the S surface.

(Insulating Resin Composition and Hardness)

The insulating resin composition is the insulating liquid resin composition containing at least one of alumina, boron nitride, aluminum nitride, magnesium oxide, and beryllium oxide, as the inorganic filler providing high thermal conductivity, in insulating liquid resin.
That is, <insulating liquid resin composition=[insulating liquid resin+inorganic filler]>+thermal curing→ cured insulating resin 27-1 holds The hardness of the cured insulating resin 27-1 obtained through curing of the insulating liquid resin composition is 80 or less (Shore A) or is 70 or less, more preferably.

On condition that the hardness exceeds 80, there are a fear that the effect of the heat dissipation may not be obtained because of deterioration in adhesion to the substrate 20 and a fear that the substrate 20 may be deformed.

The hardness is indicated with use of a Shore A scleroscope as a representative. Soft materials may be measured with use of Shore F, Shore 00, ASKER C, or the like. On condition that the Shore A hardness is 80 or less, such measurement may be carried out with use of Shore E, Shore 00, ASKER C, or the like.

(Low-Molecular Component Content in Cured Material)

The cured insulating resin 27-1 is cut into small pieces, from which components of the cured insulating resin 27-1 are extracted with use of an organic solvent such as hexane or acetone. With use of a gas chromatography mass spectrometer (GC/MS) and helium as carrier gas, amounts of low-molecular components are analyzed while a temperature of the extraction solvent is increased from 40° C. to 300° C. The amounts of low-molecular components are 2,000 ppm or less or 1,000 ppm or less, preferably.

In excess of 2,000 ppm, there is a fear that contamination of the electric component and interconnections, an electrical contact fault, or deterioration in characteristics of the electrical component may be caused by the cooling-heating cycles in use of the cured insulating resin 27-1.

(Outgas from Cured Material)

The cured insulating resin 27-1 is tested in a vacuum environment ($7 \times 10^{-3}$ Pa or lower) and under test conditions of a heating temperature of 125° C., retention time of 24 hours, and an emitted gas cooling temperature of 25° C., in conformity with ASTM E595. Measurement for outgas emitted from the cured insulating resin 27-1 under the test conditions is carried out.

Total Mass Loss (TML) calculated from results of the measurement should be 1% or less and Collected Volatile Condensable Material (CVCM) calculated from the same should be 0.1% or less.

On condition that TML exceeds 1% or that CVCM exceeds 0.1%, there is a fear that the contamination of the electric component and the interconnections, an electrical contact fault, or the deterioration in the characteristics of the electrical component may be caused by the cooling-heating cycles in the use.

(Glass Transition Point)

The glass transition point of the cured insulating resin 27-1 is −10° C. or lower or −20° C. or lower, preferably. More preferably, the glass transition point is a temperature that is lower than a lower side of temperatures of the cooling-heating cycles in the use of the cured insulating resin 27-1. On condition that the glass transition point is higher than −10° C., there is a fear that unattainability for stable heat dissipation, warpage of the substrate 20, or the like may be caused by increase in deformation of the cured insulating resin 27-1, in the cooling-heating cycles in the use of the cured insulating resin 27-1.

(Insulating Liquid Resin)

The insulating liquid resin may be thermosetting liquid resin such as silicone resin or urethane resin.

(Silicone Resin)

As the silicone resin, publicly known silicone resin may be used as long as the silicone resin is liquid at a room temperature. A curing system for the silicone resin may be of either addition reaction type or condensation reaction type. The silicone resin may be rubbery (elastomeric) or gelled after being cured.

A base polymer has an average molecular weight between 5,000 and 100,000 and is liquid having a viscosity between 1 Pa·s and 100,000 Pa·s at 25° C., for instance. The base polymer is publicly known organopolysiloxane having at least one kind of alkyl group, alkenyl group, allyl group, hydroxyl group, hydrogen group, alkoxyalkyl group, and alkoxysilyl group in side chains and at ends and having a linear, cyclic, branched, or ladder-like main chain structure. The base polymer may be a mixture of two or more kinds of organopolysiloxane.

In the addition reaction type, a composition containing organopolysiloxane including alkenyl group as the base polymer, hydrogen siloxane as a crosslinking agent, and a platinum compound as a catalyst may be used. Amounts of those may be publicly known effective amounts that result in advance in a curing reaction and obtainment of a hardness required after the curing.

In the condensation reaction type, a composition containing organopolysiloxane including silanol group as the base polymer, a silane compound such as alkoxysilane or acetoxysilane as the crosslinking agent, and an organotin compound as the catalyst may be used.

Amounts of those may be conventionally and publicly known effective amounts that result in the advance in the curing reaction and the obtainment of the hardness required after the curing.

(Urethane Resin)

The urethane resin is a resin having a urethane bond in a composition obtained by combination and copolymerization of polyol resin having a plurality of hydroxyl groups in one molecule as a main agent and a compound having two or more isocyanate groups in one molecule as a curing agent.

As the urethane resin, publicly known urethane resin may be used as long as the urethane resin is liquid having a viscosity between 1 Pa·s and 100,000 Pa·s at 25° C. after being mixed.

As the polyol resin, for instance, polyester-based polyol, dicarboxylate-based polyol, polyether-based polyol, polytetramethylene polyoxyglycol, castor-oil-based polyol, ε-caprolactone-based polyol, polyoxypolyalkylene-based polyol, β-methyl-δ-valerolactone-based polyol, carbonate-based polyol, or the like that are publicly known may be used or two or more kinds thereamong may be used in combination.

As the isocyanate compound, tolylene diisocyanate, naphthalene diisocyanate, hexamethylene diisocyanate, xylidine diisocyanate, diphenylmethane diisocyanate, isophorone diisocyanate, cyclohexyl diisocyanate, or the like that are publicly known may be used or two or more kinds thereamong may be used in combination.

An appropriate urethanization catalyst may be used in order to promote a urethanization reaction. As the urethanization catalyst, a publicly known catalyst such as tertiary amine compound or organometallic compound may be used. As urethanization catalysts, triethylenediamine, N,N'-dimethylhexamethylenediamine, N,N'-dimethylbutanediamine, diazabicyclo(5,4,0)undecene-7 (DBU) and DBU salt, lead octylate, dibutyltin laurate, bismuth tris(2-ethyl hexanoate), titanium diisopropoxy bis(ethyl acetoacetate), and the like may be enumerated, for instance.

A formulation of the polyol and the isocyanate compound is calculated from an equivalence ratio of the isocyanate groups (NCO) of the isocyanate to the hydroxyl groups (OH) of the polyol. The equivalence ratio (NCO/OH) is not to be particularly specified but is preferably in a range between 0.95 and 1.05. It is undesirable for the equivalence ratio to exceed 1.05, because the hardness of the cured insulating resin composition is increased. In addition, it is undesirable because carbon dioxide as a by-product makes void remain in the cured material and thus deteriorates insulation characteristics. On the other hand, it is undesirable for the equivalence ratio to be less than 0.95, because slow progress in the curing reaction is prone to result in uncured material and insufficient production stability. Besides, it is undesirable because of insufficient heat resistance.

(Filler for Obtainment of Thermal Conductivity)

The filler having the thermal conductivity has a role of providing the composition (cured material) with the thermal conductivity and a thermally conductive filler that is publicly known may be used as the filler. As examples of the filler, alumina powder, magnesium oxide powder, boron nitride powder, aluminum nitride powder, beryllium oxide powder, zinc oxide powder, silicon nitride powder, silicon oxide powder, aluminum powder, copper powder, silver powder, nickel powder, gold powder, diamond powder, carbon powder, indium, gallium, and the like may be enumerated.

On condition that it is necessary to ensure not only thermal paths but also insulation performance between the substrate 20 and the chassis 10, powder providing high insulation performance, such as alumina powder, magnesium oxide powder, boron nitride powder, aluminum nitride powder, beryllium oxide powder, or silicon oxide powder is preferably used.

As the thermally conductive filler, one kind of such filler may be solely used or two or more kinds of such filler may be mixed to be used. The thermally conductive filler preferably has a thermal conductivity equal to or higher than 10 W/m·K. That is because the thermal conductivity lower than 10 W/m·K makes it impossible to provide a sufficient thermal conductivity for the composition (cured material). An average particle size of the filler to provide the thermal conductivity is between 0.1 μm and 200 μm inclusive, or between 0.5 μm and 100 μm inclusive, preferably.

As the thermally conductive filler having such an average particle size, one kind of such filler may be solely used or two or more kinds of such filler having different particle sizes may be mixed to be used. The thermally conductive filler having an average particle size smaller than 0.1 μm is undesirable because particles may be made prone to aggregate and poor in liquidity. The thermally conductive filler having an average particle size larger than 100 μm is undesirable because particles may be made prone to settle and because the thermal conductivity of the cured material may be consequently made nonuniform.

A form of the filler may be amorphous or spherical or any form is allowed. The average particle size may be measured as an average volume value D50 (that is, a particle size or a median size at time when an accumulated volume is 50%) in a particle size distribution measurement by laser diffractometry.

(Insulating Liquid Resin Composition)

The insulating resin composition is obtained by mixture of the inorganic filler, providing the high thermal conductivity, with the insulating liquid resin. Increase in an amount of the filler causes increase in the thermal conductivity of the cured material. Then workability is deteriorated by increase in viscosity of the composition or adhesion to the substrate is deteriorated by increase in the hardness of the cured material. As a result, the effect of the heat dissipation as a target may not be obtained.

Therefore, a ratio of the inorganic filler contained in the insulating liquid resin composition is not particularly confined as long as the viscosity of the insulating resin composition blended with the inorganic filler is equal to or lower than 300 Pa·s at 25° C.

In case where the insulating resin composition is required to be poured into a narrow gap, it is desirable for the viscosity to be equal to or lower than 50 Pa·s. The inorganic filler is preferably in a range
between 40 vol % and 80 vol % inclusive, or
more preferably in a range
between 50 vol % and 75 vol % inclusive, for instance.

It is undesirable for the ratio to exceed 80 vol % because the workability may be deteriorated by the increase in the viscosity of the insulating resin composition or because stable heat dissipation characteristics may not be obtained due to the increase in the hardness of the cured material. On the other hand, it is undesirable for the inorganic filler to be lower than 40 vol % because improvement in the thermal conductivity of the cured material may not be expected due to a high ratio of the resin. In order to control reactivity of the insulating resin composition or the adhesion to the substrate, an additive such as a reaction controlling agent such as an acetylene compound, various nitrogen compounds, an organophosphorus compound, an oxime compound, and an organochloro compound or an adhesion modifying agent such as silane coupling agent may be appropriately added as required.

(Curing Conditions)

Curing conditions for the insulating liquid resin composition may be similar to curing conditions for silicone potting material or urethane potting material that are publicly known.

A curing temperature is
preferably from the room temperature to 180° C. or less or
more preferably
from the room temperature to 150° C. or less.

On condition that the curing temperature is equal to or lower than the room temperature, there is a fear that insufficient curing may result in volatilization of unreacted raw materials in the cooling-heating cycles in the use and the contamination of the electric component. On condition that the curing temperature exceeds 150° C., there is a fear that the temperature may exceed a heat-resistance temperature for the electric component and may thereby cause deterioration of the electric component.

Though curing time is not confined as long as the required hardness is attained, the curing time at the room temperature is
48 hours or shorter time or, preferably,
24 hours or shorter time or
the curing time in thermal curing is
between 0.1 hours and 12 hours inclusive or,
preferably,
between 0.5 hours and 6 hours inclusive.

In case where there is a concern about outgas in the use of the cured insulating resin 27-1, the thermal curing is preferably carried out. By a heating process at an upper limit allowable temperature for the electric component, for instance, the low-molecular components in the cured material that are volatile may be decreased and adverse effects of the outgas may be avoided.

A breakdown field of the cured insulating resin composition is preferably equal to or stronger than 10 kV/mm or more preferably equal to or stronger than 15 kV/mm.

The breakdown field weaker than 10 kV/mm may necessitate increasing distances between interconnections for the electric component and distances between interconnection patterns on the substrate 20, depending on a working voltage, and may decrease a contribution of decrease in sizes of power supply members.

(Volume Resistivity of Cured Insulating Resin)

A volume resistivity of the cured insulating resin composition is
preferably 1.0 E+10 Ω·cm or more or, more preferably,
1.0 E+12 Ω·cm or more.

The volume resistivity lower than 1.0 E+10 Ω·cm may necessitate increasing the distances between the interconnections for the electric component and the distances between the interconnection patterns on the substrate 20, depending on the working voltage, and may decrease the contribution of the decrease in the sizes of the power supply members. Before potting of the insulating liquid resin composition onto beat-generating components or the substrate or pouring of the insulating liquid resin composition into an enclosure, those adherends may be treated with surface modifier (primer) to improve the adhesion. A publicly known primer for silicone or for urethane may be used.

In summary of methods of manufacturing the power supply device 100-1, a manufacturing method of pouring the resin into between the substrate 20 and the chassis 10 is as follows.

The method of manufacturing the power supply device 100-1 includes
a substrate placement step of placing the substrate 20 with respect to the chassis surface 11 so that the one surface 20a of the substrate 20 may face the chassis surface 11,
a pouring step of pouring the insulating liquid resin composition into between the one surface 20a of the substrate 20 and the chassis surface 11, and
a curing step of forming the chassis-side resin part 91 by curing the poured liquid resin composition.

In the liquid resin composition, silicone or urethane is used as the base resin and at least one of alumina, boron nitride, aluminum nitride, magnesium oxide, and beryllium oxide is contained as the inorganic filler.

The hardness of the chassis-side resin part 91 is preferably 70 or less in Shore A hardness. Preferably, the chassis-side resin part 91 has the low-molecular component volatilization volume of 1,000 ppm or less in 300° C. heating and has the glass transition point of −20° C. or lower.

A summary of a method of manufacturing the power supply device 100-1 in which the substrate 20 is installed onto the chassis 10 after curing of the resin is as follows.

The method of manufacturing the power supply device 100-1 includes a pouring step of pouring the insulating liquid resin composition onto the chassis surface 11, a curing step of forming the chassis-side resin part 91 by curing the liquid resin composition poured onto the chassis surface 11, and an installation step of installing the substrate 20 onto the chassis 10 so that the one surface 20a of the substrate 20 may face the chassis surface 11 and may come into intimate contact with the chassis-side resin part 91.

In the liquid resin composition, silicone or urethane is used as the base resin and at least one of alumina, boron nitride, aluminum nitride, magnesium oxide, and beryllium oxide is contained as the inorganic filler.

The hardness of the chassis-side resin part 91 is preferably 70 or less in Shore A hardness. Preferably, the chassis-side resin part 91 has the low-molecular component volatilization volume of 1,000 ppm or less in 300° C. heating and has the glass transition point of −20° C. or lower.

In both of the manufacturing method, the viscosity of the liquid resin composition is preferably equal to or lower than 300 Pa-s at 25° C.

Embodiment 2

Figure 4:
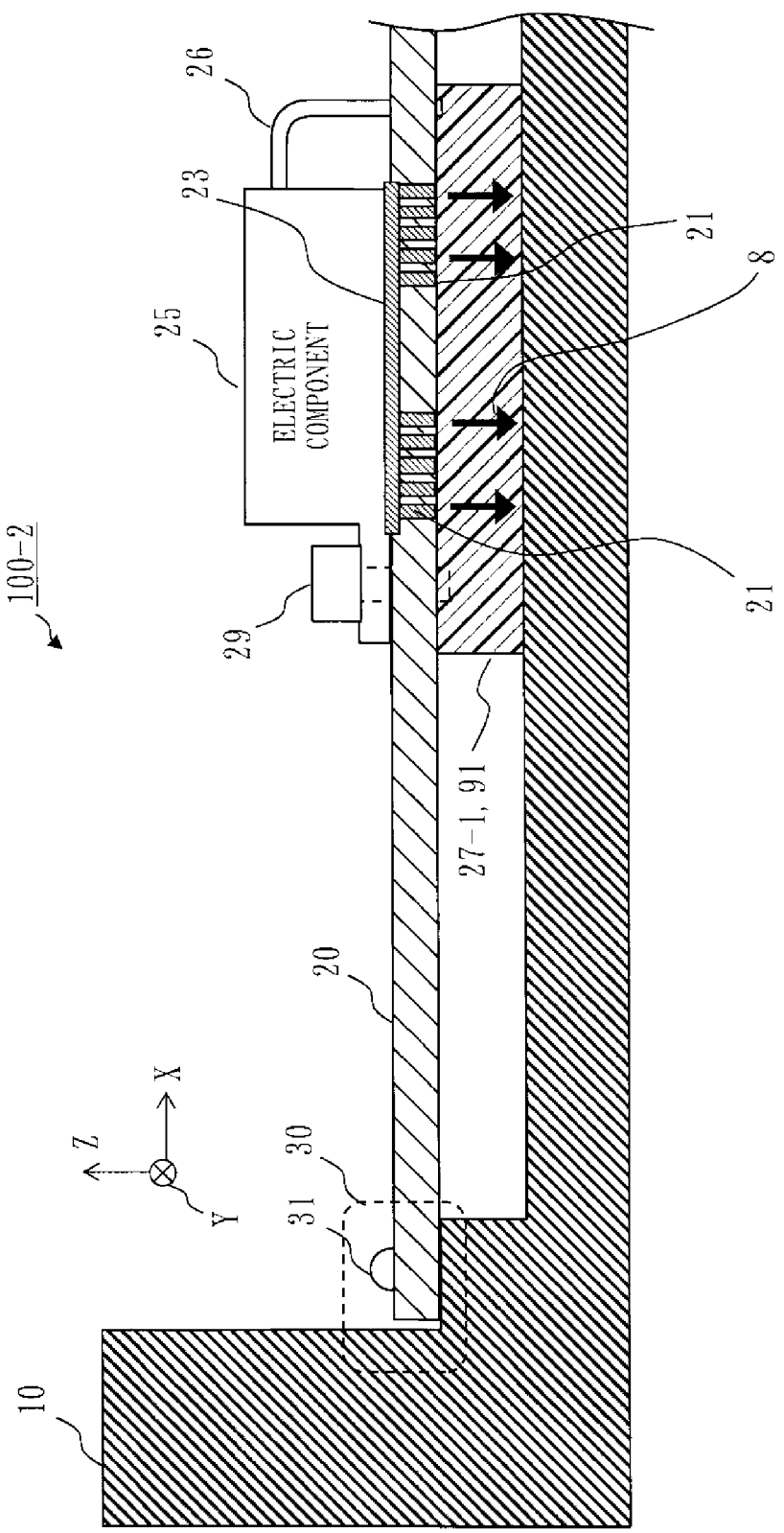
FIG. 4 is a diagram illustrating Embodiment 2 and a sectional view of a power supply device.
Figure 5:
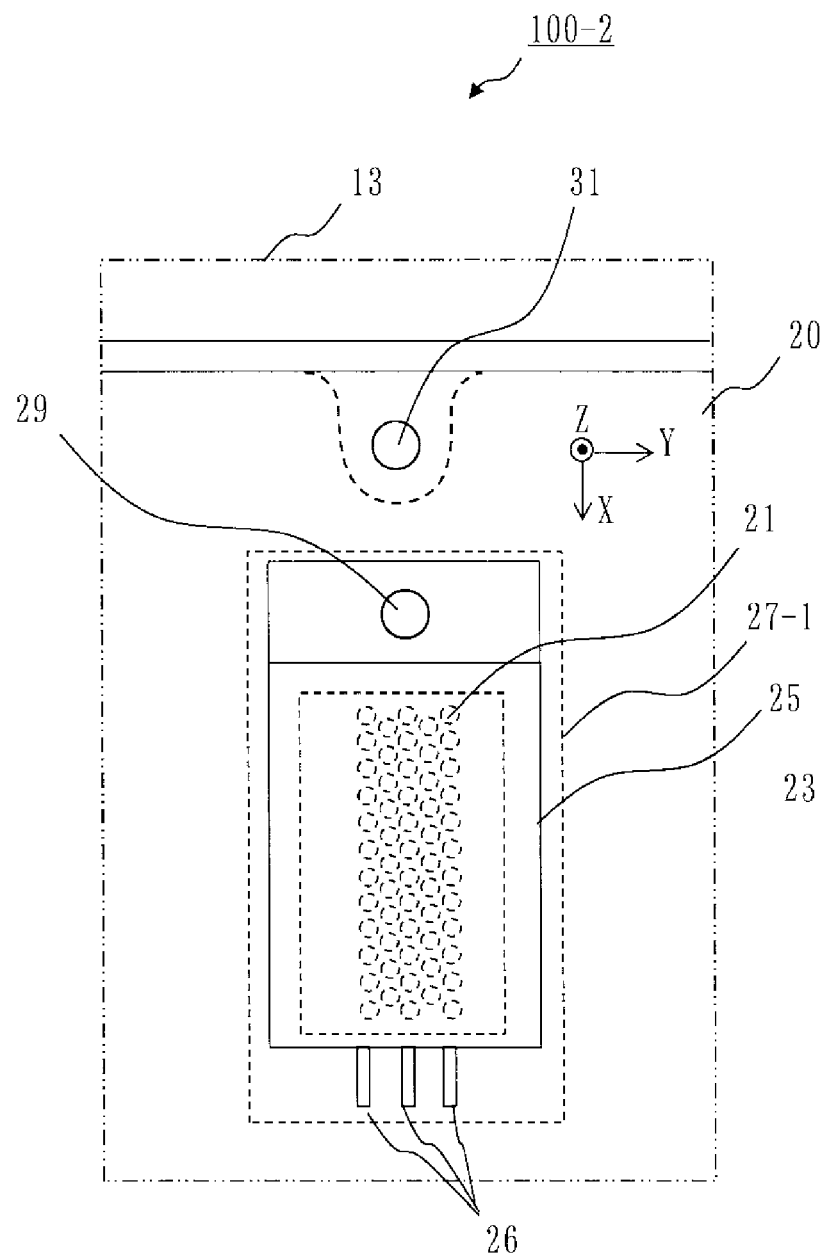
FIG. 5 is a diagram illustrating Embodiment 2 and schematically illustrating a plan view of the power supply device.

With reference to FIGS. 4 and 5, a power supply device 100-2 of Embodiment 2 will be described.

FIG. 4 is a sectional view of the power supply device 100-2. FIG. 5 is a diagram corresponding to FIG. 3 and a schematic diagram equivalent to a view in an arrow direction −Z in FIG. 4.

In the power supply device 100-2, in contrast to the power supply device 100-1, an electric component 25 such as TO-254 package in which leads as the electrodes 26 are formed is used as a space power MOSFET. In the power supply device 100-2, the electric component 25 that is a heat-generating component is TO-254. The power supply device 100-2 differs from the power supply device 100-1 in (1) to (3) below. The other configurations are the same as configurations of the power supply device 100-1.

(1) In a configuration, the filled through-holes 21 are provided directly beneath the electric component 25 so as to conduct the heat to the S surface of the substrate 20.

(2) Between a bottom surface of the electric component 25 and the substrate 20, thermally-conductive material 23 is placed in order to efficiently conduct the heat 8 of the electric component 25 to the filled through-holes 21. The thermally-conductive material 23 is solder paste or silver paste, for instance.

(3) The electric component 25 is fixed to the substrate 20 by a fixation screw 29.

Ordinarily, the electric component 25 of the same type to be used for space has a design for heat dissipation in which a semiconductor is mounted in a position adjacent to a surface to be in contact with the substrate 20 or the chassis 10 and the like in the electric component 25 (in the package). Therefore, the heat may be efficiently dissipated to the chassis 10 by the configurations of FIG. 4. Filling of the through-holes with solder, another metal, or thermally conductive resin and pouring of the resin having high thermal conductivity into between the S surface of the substrate 20 and the chassis 10, other than (1) to (3) mentioned above, are the same as in Embodiment 1.

Embodiment 3

Figure 6:
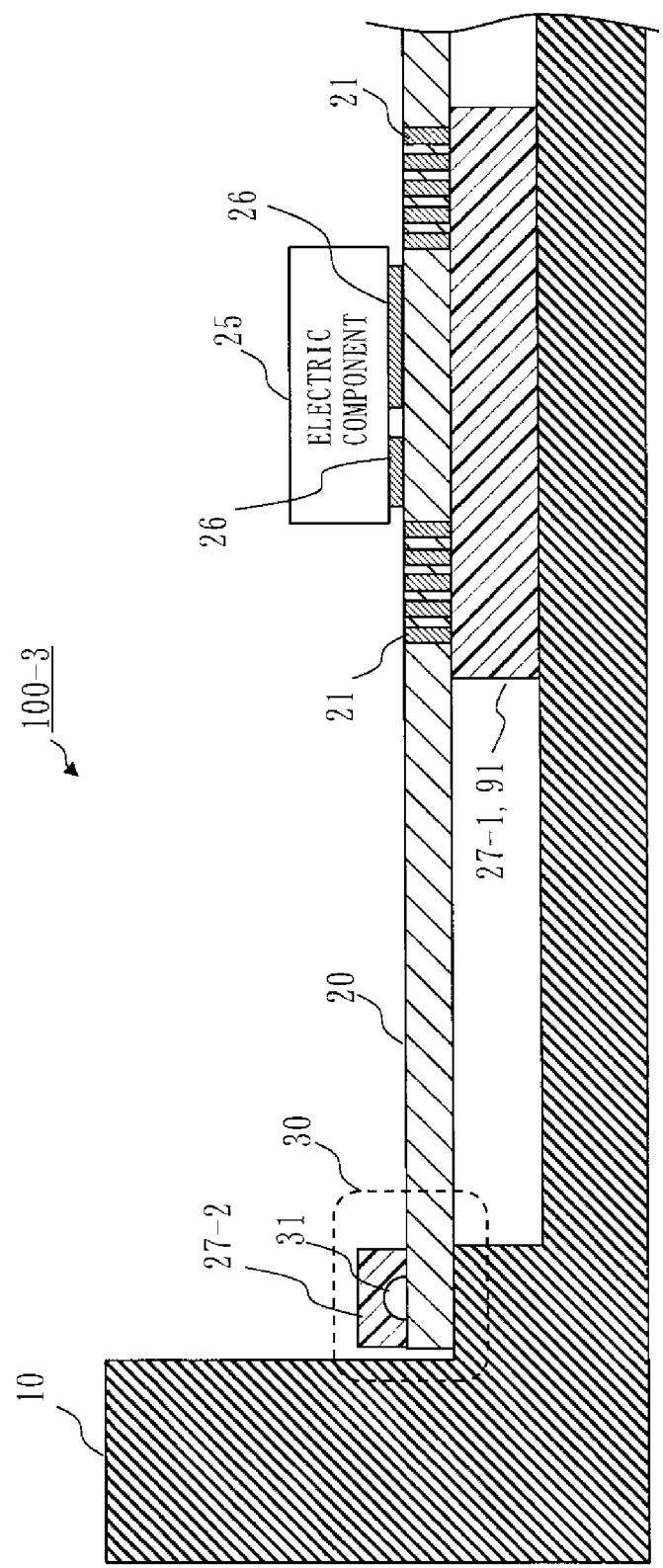
FIG. 6 is a diagram illustrating Embodiment 3 and a sectional view of a power supply device.

With reference to FIG. 6, a power supply device 100-3 of Embodiment 3 will be described.

FIG. 6 is a diagram for description of the power supply device 100-3. In contrast to the power supply device 100-1, the power supply device 100-3 has a configuration with potting of a head of the substrate fixation screw 31 with resin 27-2 having high thermal conductivity. The other configurations of the power supply device 100-3 are the same as the configurations of the power supply device 100-1.

In space, gases such as air do not exist around the power supply device 100-3 in such a quantity as to influence heat conduction and thus heat generated from the substrate 20 is dissipated to the chassis 10 through the substrate fixation screw 31 that fixes the substrate 20. Due to absence of the gases such as air, however, the heat is dissipated only from a contact area formed between the substrate 20 and the chassis 10 by pressure of the substrate fixation screw 31. Therefore, a number of the screws needs to be increased as the quantity of the heat increases. Paths for the heat dissipation may be enhanced by coverage of an end part of the substrate 20 including the substrate fixation screw 31 and the chassis 10 with the resin 27-2 having the high thermal conductivity as the potting material. The same resin as the cured insulating resin 27-1 may be used as the resin 27-2 in this example. In a configuration in which the plurality of screw holes 12 exist on the chassis 10 and in which the substrate fixation screws 31 are screwed into the screw holes 12, as stated in description on FIG. 2, the heads of the substrate fixation screws 31 may be covered with the resin 27-2. The plurality of substrate fixation screws 31 and the plurality of screw holes 12 are placed on the peripheral edge part along the perimeter of the substrate 20 and are provided at specified intervals in the four corners or on the four sides of the rectangle, for instance.

Embodiment 4

Figure 7:
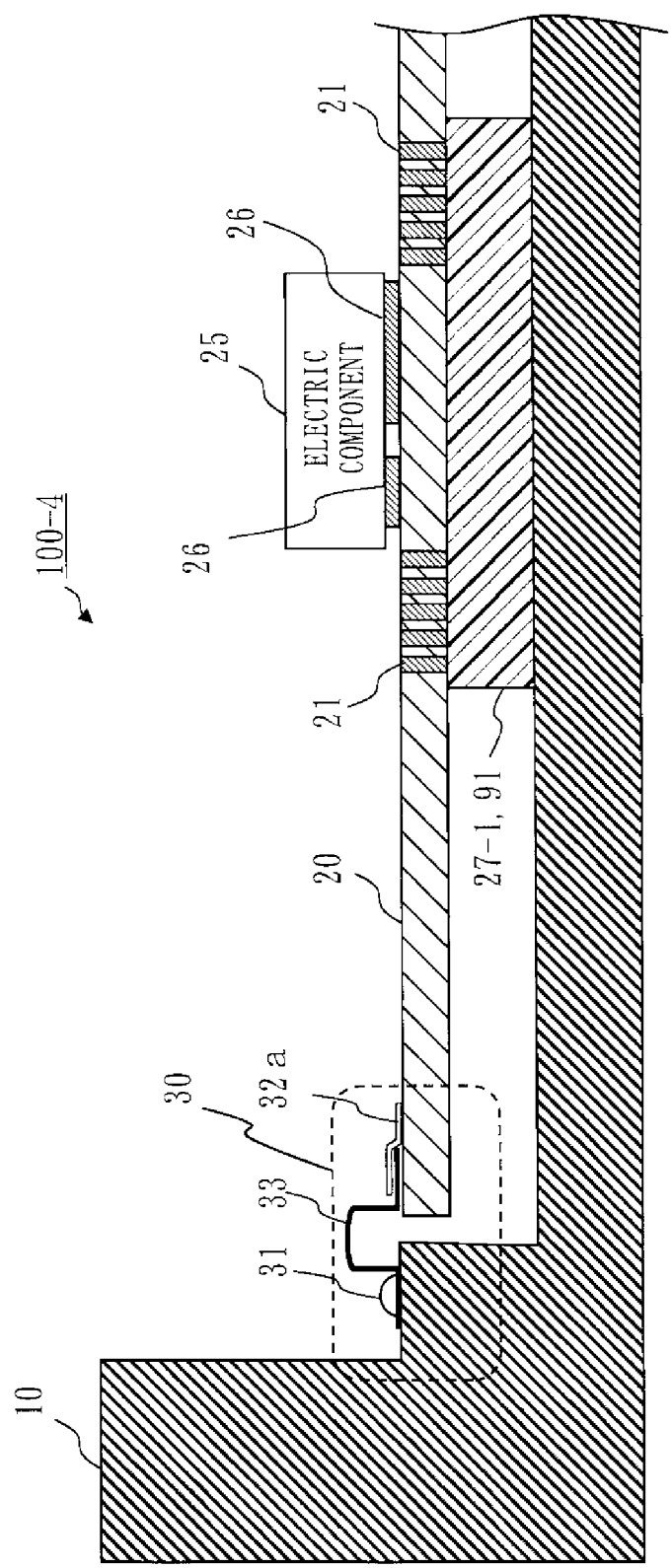
FIG. 7 is a diagram illustrating Embodiment 4 and a sectional view of a power supply device.
Figure 8:
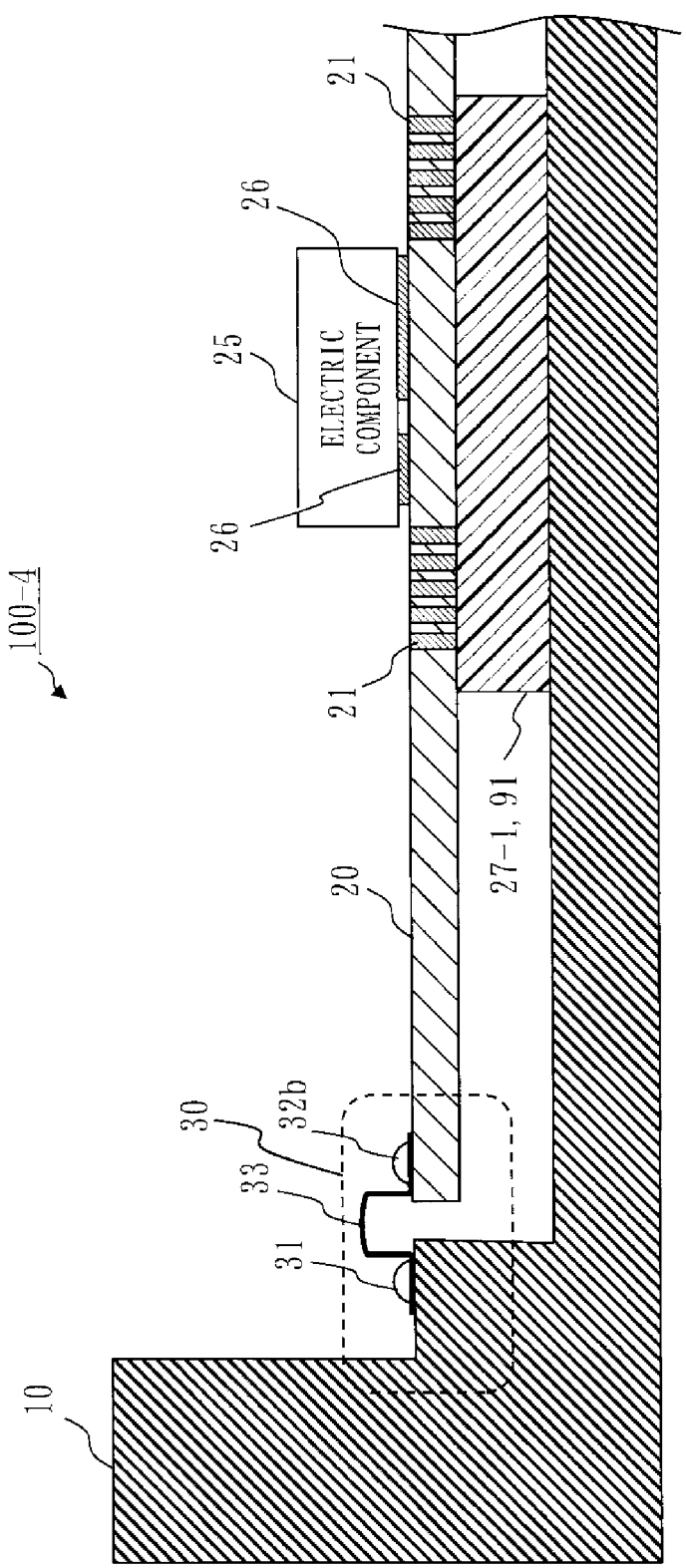
FIG. 8 is a diagram illustrating Embodiment 4 and a sectional view of the power supply device.

FIGS. 7 and 8 are diagrams illustrating a power supply device 100-4 of Embodiment 4. The power supply device 100-4 of FIGS. 7 and 8 is the same as the power supply device 100-1, except that a configuration of the fixation part 30 differs from that of the power supply device 100-1.

The power supply device 100-4 illustrated in FIG. 7 has a configuration including a spring fixture 33 having spring characteristics between the substrate 20 and the chassis 10. In general, a coefficient of thermal expansion of the cured insulating resin 27-1 is several hundred ppm, which is greater than that of metal from several ppm to tens of ppm. When changes in sizes such as thickness and width of the cured insulating resin 27-1 filled between the chassis 10 and the substrate 20 are caused by the heat, therefore, the spring fixture 33 makes it possible for the substrate 20 to follow the change of the cured insulating resin 27-1. As a result, separation between the substrate 20 and the cured insulating resin 27-1 may be reduced. Though the substrate 20 and the spring fixture 33 are connected by solder 32a in FIG. 7, the substrate 20 and the spring fixture 33 may be fastened by a screw 32b as in the power supply device 100-4 of FIG. 8. The plurality of substrate fixation screws 31 and a plurality of spring fixtures 33 are placed on the peripheral edge part along the perimeter of the substrate 20 and are provided at specified intervals in the four corners or on the four sides of the rectangle, for instance.

Embodiment 5

Figure 9:
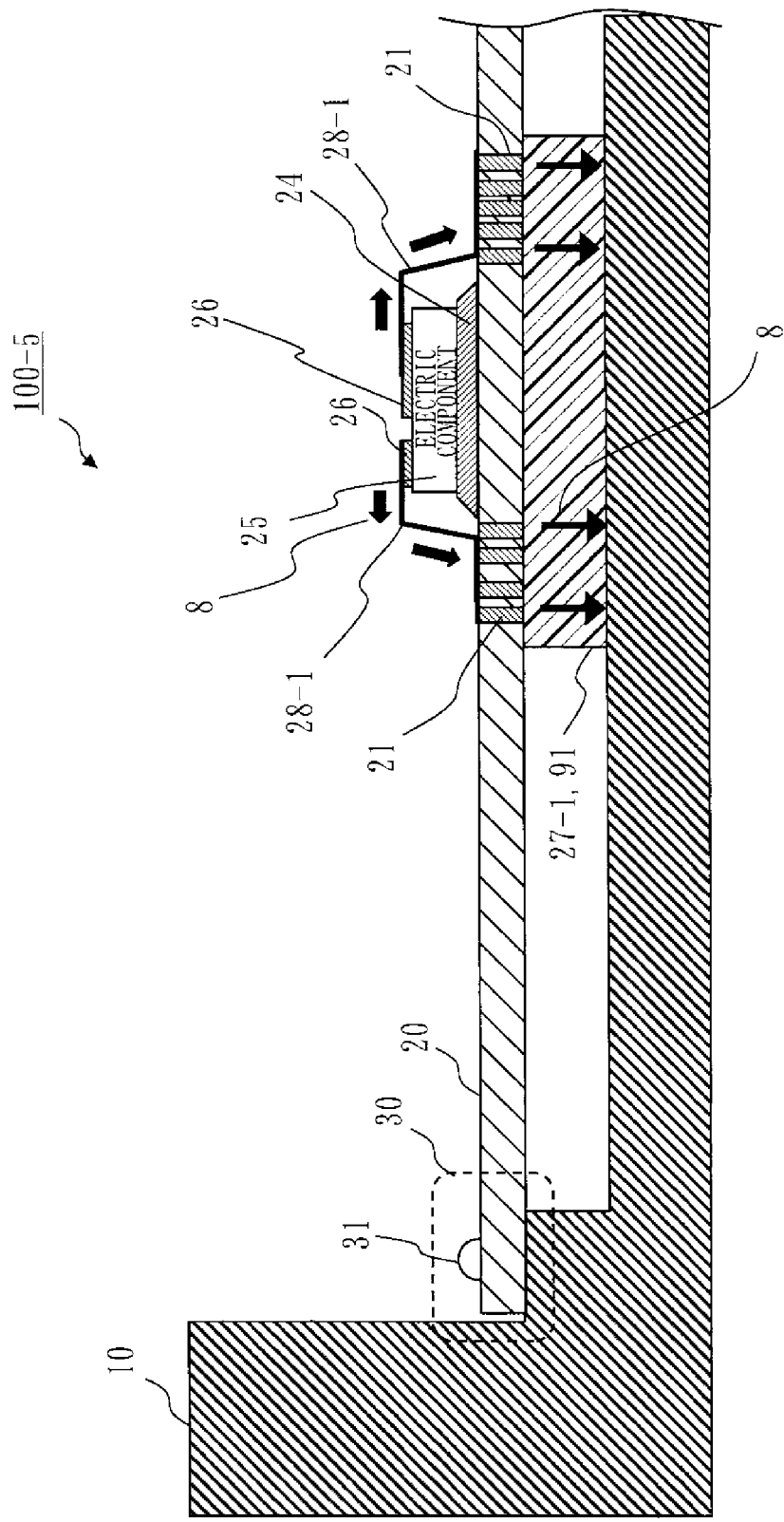
FIG. 9 is a diagram illustrating Embodiment 5 and a sectional view of a power supply device.

FIG. 9 is a diagram illustrating a power supply device 100-5 of Embodiment 5. The power supply device 100-5 differs from the power supply device 100-1 in (1) to (3) below. The other configurations are the same as the configurations of the power supply device 100-1.

(1) The electrodes 26 of the electric component 25 are on top of the electric component 25.

(2) The electrodes 26 and the filled through-holes 21 are connected by wires or bus bars that are electrode connection parts 28-1.

(3) The electric component 25 is fixed to the substrate 20 by adhesive 24.

In the electric component 25 mounted on the substrate 20, in general, the electrodes 26 are directly connected to the circuit pattern on the substrate 20. In case where the substrate 20 and the electric component 25 greatly differ in the coefficient of thermal expansion, however, soldered parts may be cracked in thermal cycles. Therefore, a method may be adopted including daringly orienting the electrodes 26 of the electric component 25 in an upward direction opposite to the substrate 20, connecting the wires or the bus bars as electrode extension parts to the electrodes 26 oriented upward, and connecting the wires or the bus bars to the circuit pattern on the substrate 20. In such a configuration, the heat dissipation is enabled by connection of the wires or the bus bars to the filled through-holes 21.

In order to attain the heat dissipation, in FIG. 9, the wires or the bus bars are used as the electrode connection parts 28-1 that are heat transfer material to connect the electrodes 26 and the filled through-holes 21.

Embodiment 6

Figure 10:
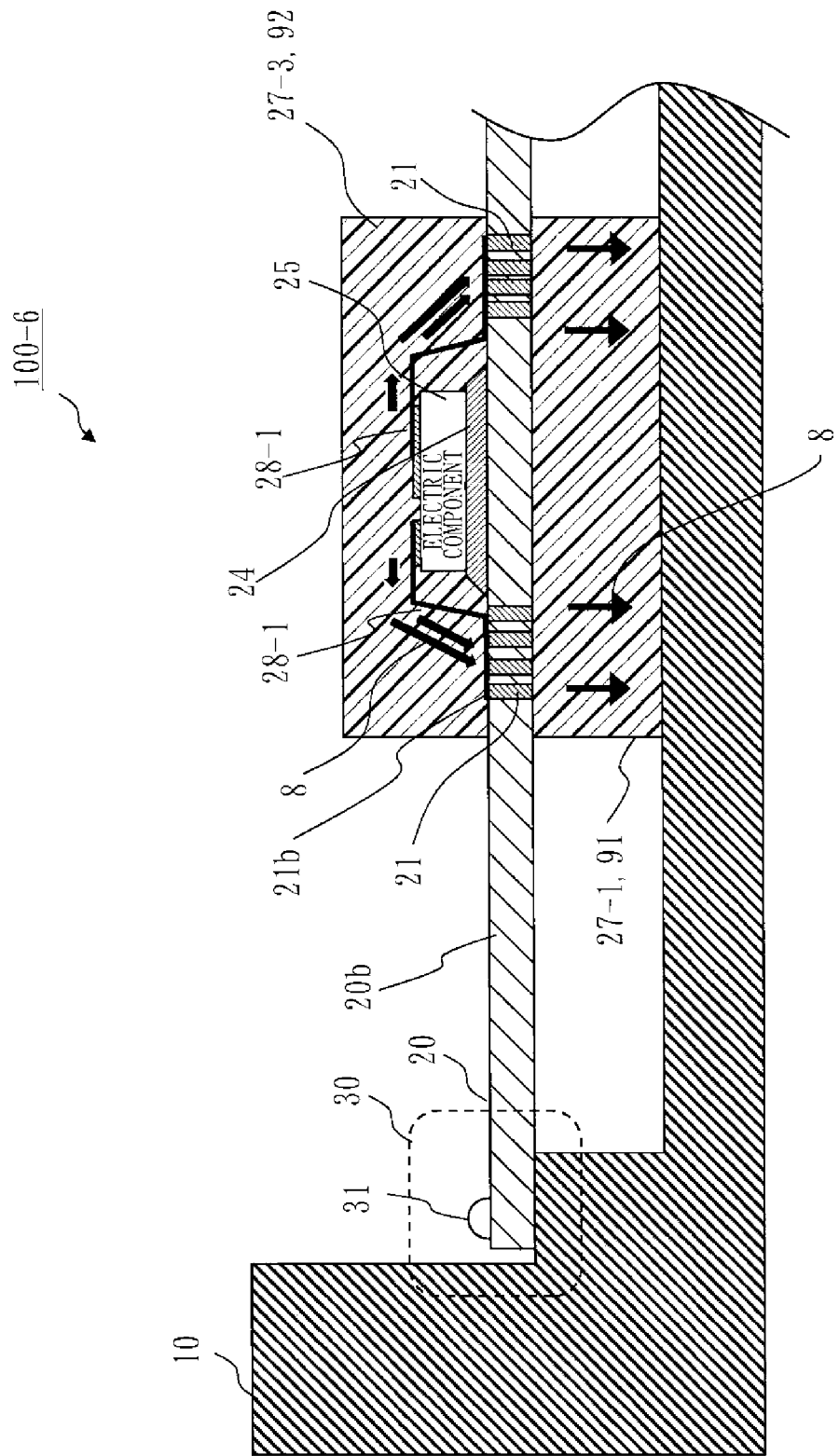
FIG. 10 is a diagram illustrating Embodiment 6 and a sectional view of a power supply device.

FIG. 10 is a diagram illustrating a power supply device 100-6 of Embodiment 6. In contrast to the power supply device 100-5, the power supply device 100-6 has a configuration in which the electric component 25 and the electrode connection parts 28-1 that are the bus bars or the wires are enclosed in cured resin 27-3. The configuration may improve the thermal conductivity. The cured resin 27-3 forms a component-side resin part 92.

As illustrated in FIG. 10, the filled through-holes 21 are placed in some positions around the electric component 25 on the substrate 20. The cured resin 27-3 is placed in a position opposed to the cured insulating resin 27-1 with respect to the substrate 20 so that the substrate 20 is interposed between the cured resin 27-3 and the cured insulating resin 27-1 that is the chassis-side resin part 91. The cured resin 27-3 is cured insulating resin to seal in the electric component 25, the other end part 21b of each of the filled through-holes 21 that appears on the other surface 20b of the substrate 20, and the electrode connection parts 28-1. The same resin as the cured insulating resin 27-1 may be used as the cured resin 27-3.

Embodiment 7

Figure 11:
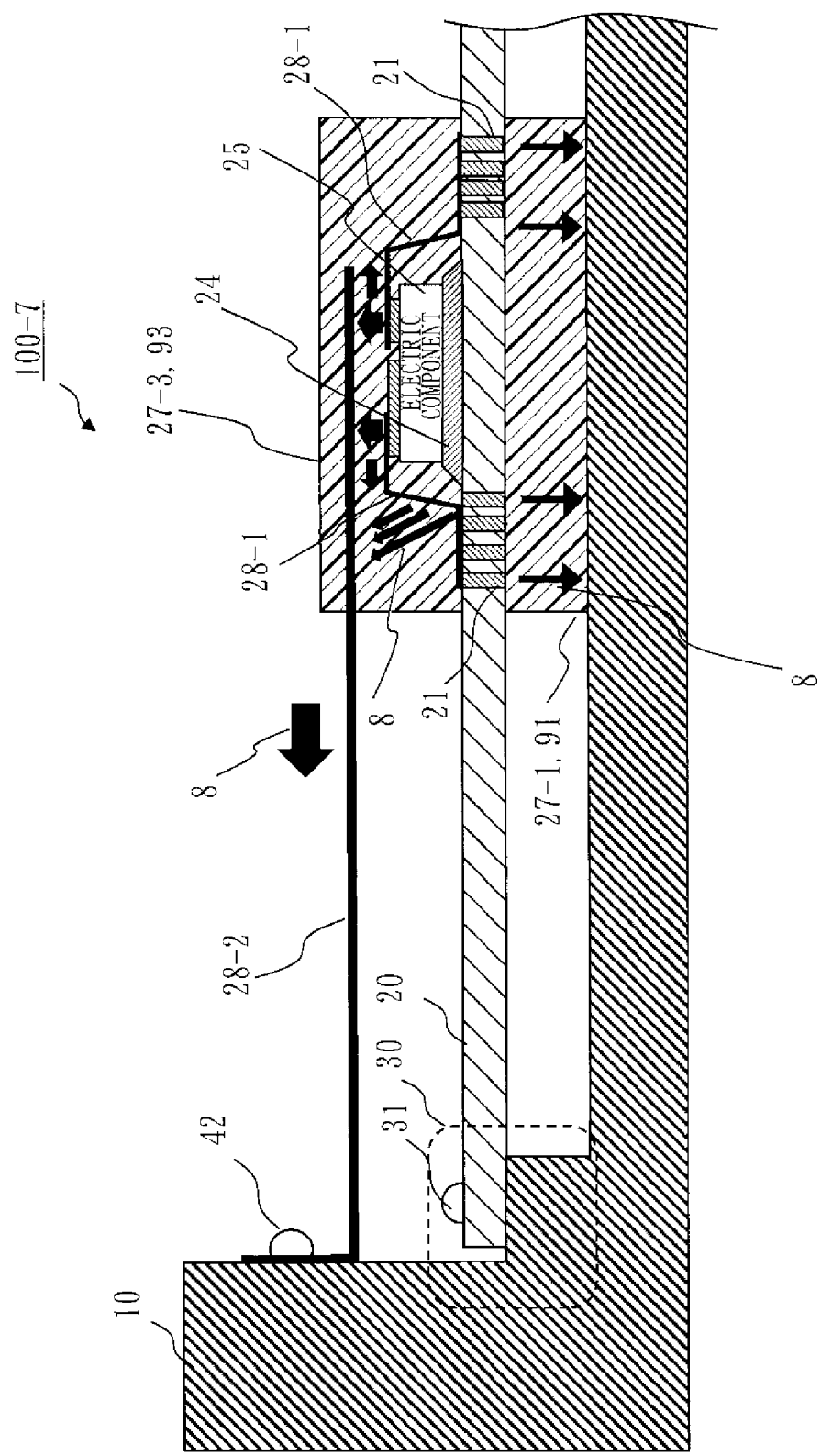
FIG. 11 is a diagram illustrating Embodiment 7 and a sectional view of a power supply device.
Figure 12:
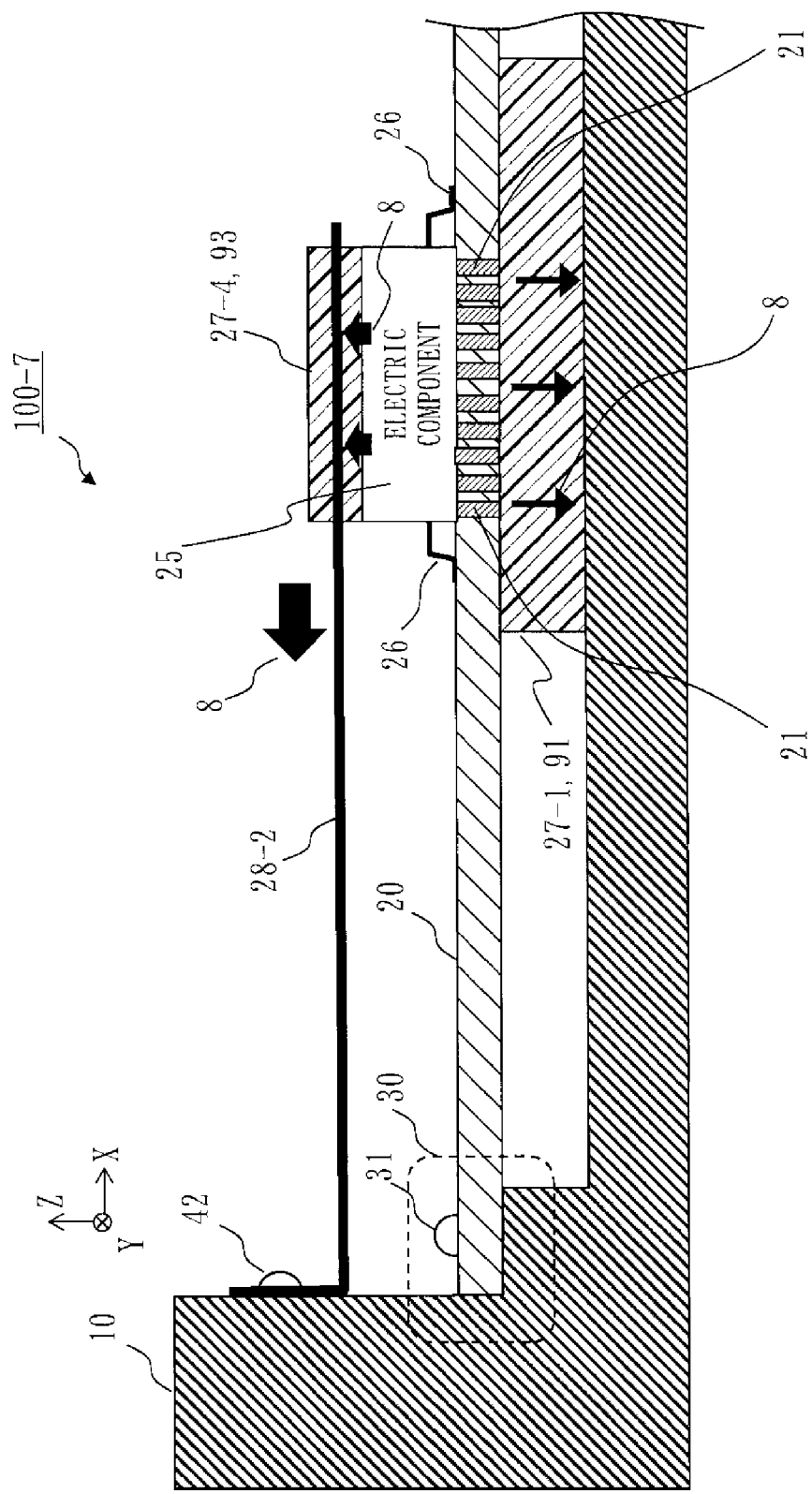
FIG. 12 is a diagram illustrating Embodiment 7 and a sectional view of the power supply device.

FIGS. 11 and 12 are diagrams illustrating a power supply device 100-7 of Embodiment 7. In contrast to the power supply device 100-6, the power supply device 100-7 illustrated in FIG. 11 has a configuration in which a bus bar for the heat dissipation that is a chassis connection part 28-2 is provided above the electric component 25. The chassis connection part 28-2 is fixed to the chassis 10 by a screw 42. The heat dissipation may be increased by the bus bar for the heat dissipation. In this example, the cured resin 27-3 of FIG. 11 forms a contact resin part 93 that is cured insulating resin.

FIG. 12 illustrates a configuration in which cured resin 27-4 that is the contact resin part 93 is placed on the top of the electric component 25. Though the electric component 25 of FIG. 12 includes the electrodes 26 similar to the electrodes 26 of the electric component 25 to be described later and illustrated in FIG. 13, a direction in which the electrodes 26 are arranged is Y direction in FIG. 12 and is X direction in FIG. 13. The same resin as the cured insulating resin 27-1 may be used as the cured resin 27-4. The configuration of FIG. 12 enables the heat dissipation from an upper part of the electric component 25, such as a transformer or an IC of SMD type, the upper part which is opposed to the substrate 20 and on which the cured resin 27-4 is molded.

As illustrated in FIGS. 11 and 12, the substrate 20 is interposed between the contact resin part 93 and the cured insulating resin 27-1 that is the chassis-side resin part 91.

The contact resin part 93 is placed in a position opposed to the cured insulating resin 27-1 with respect to the substrate 20 so as to be in contact with at least a portion of the electric component 25. The chassis connection part 28-2 having heat transferability connects the contact resin part 93 and the chassis 10.

Embodiment 8

Figure 13:
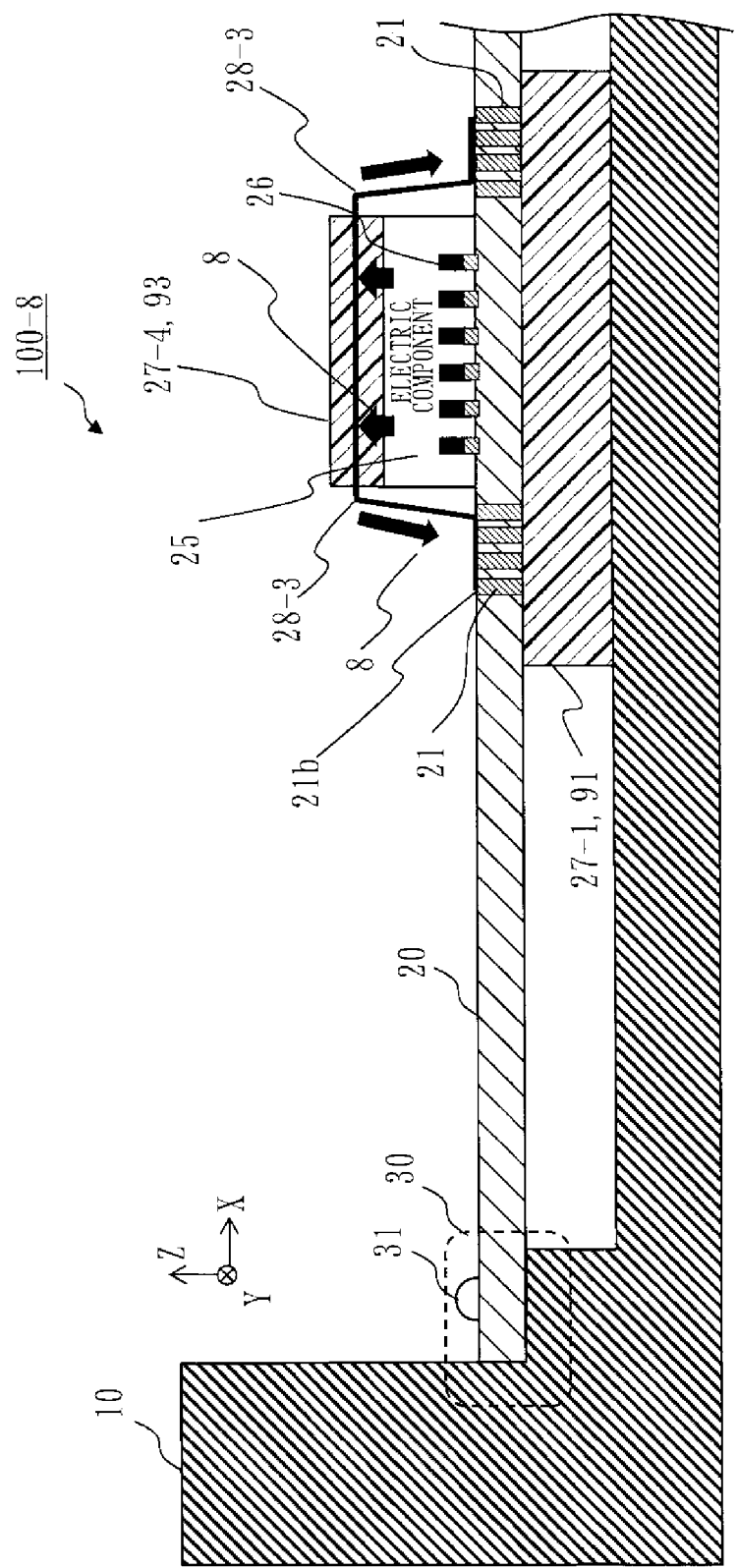
FIG. 13 is a diagram illustrating Embodiment 8 and a sectional view of a power supply device.

FIG. 13 is a diagram illustrating a power supply device 100-8 of Embodiment 8. In the power supply device 100-7, the chassis connection part 28-2 that is the bus bar provided for the heat dissipation is connected to the chassis 10.

In the power supply device 100-8, a through-hole connection part 28-3 is connected to the other end part 21b of each of the filled through-holes 21 on the substrate 20. Thus the heat 8 is dissipated through the cured insulating resin 27-1 to the chassis 10. As a result, paths for the heat dissipation may be made shorter than the paths for the heat dissipation in the power supply device 100-7 of FIG. 12.

That is, the filled through-holes 21 are placed in some positions around the electric component 25 on the substrate 20, as illustrated in FIG. 13. The substrate 20 is interposed between the contact resin part 93 and the cured insulating resin 27-1 that is the chassis-side resin part 91. The contact resin part 93 is placed in a position opposed to the cured insulating resin 27-1 with respect to the substrate 20 so as to be in contact with at least a portion of the electric component 25. The through-hole connection part 28-3 connects the contact resin part 93 and the other end part 21b of each of the filled through-holes 21.

Embodiment 9

Figure 14:
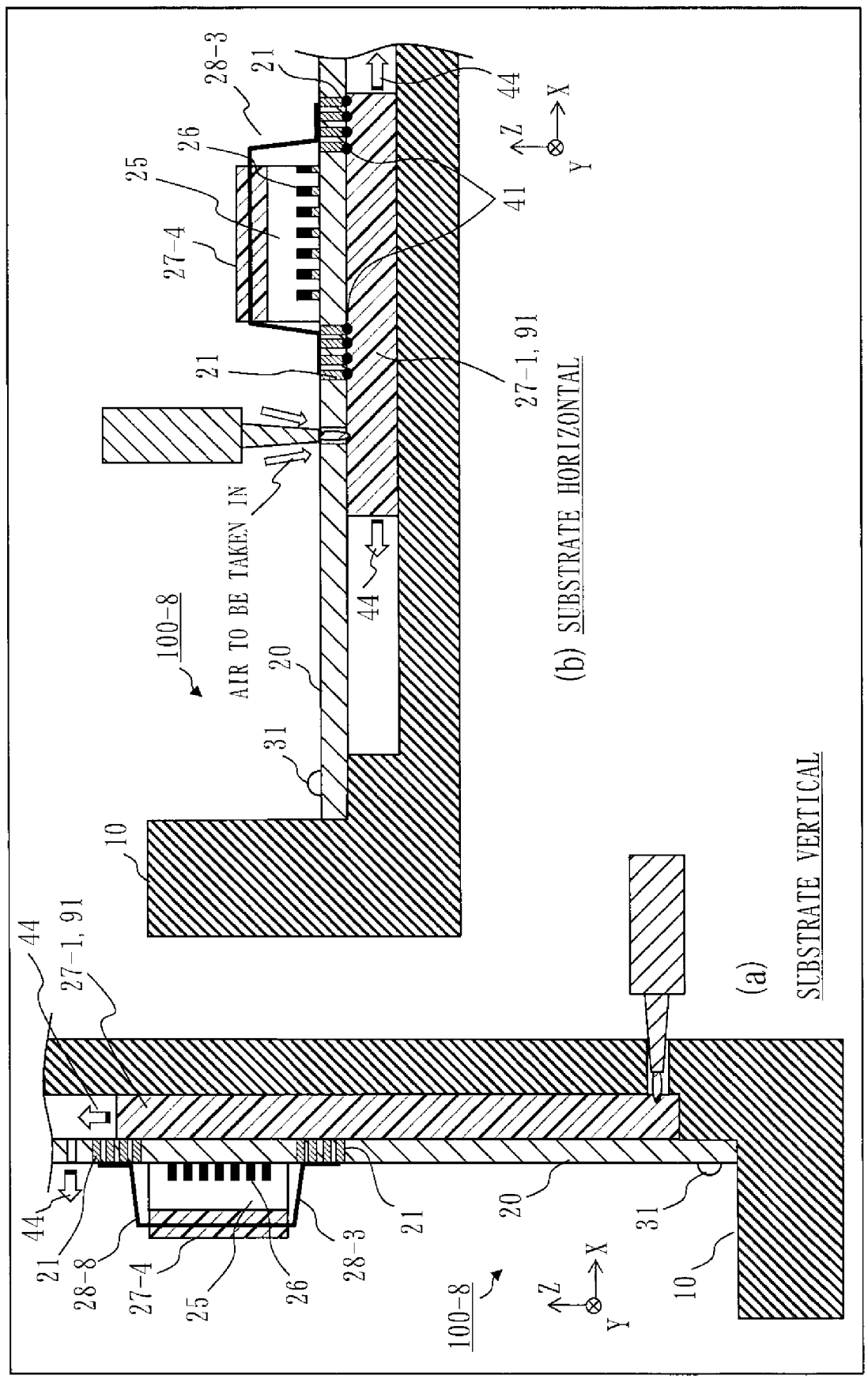
FIG. 14 is diagrams illustrating Embodiment 9 and illustrating a method of manufacturing a power supply device in atmosphere.

FIG. 14 is diagrams representing Embodiment 9. Embodiment 9 relates to a method of manufacturing the power supply device 100 in an environment where atmosphere exists. Embodiment 9 sets forth a work of forming a layer of the cured insulating resin 27-1 (insulating resin composition) between the substrate 20 and the chassis 10, that is, a work of injecting the insulating liquid resin composition, not in a vacuum but in a common atmospheric environment on the ground.

Though the power supply device 100-8 is used as an example in Embodiment 9, the method of Embodiment 9 may be applied to the power supply devices 100-1 to 100-7.

(a) of FIG. 14 illustrates the desirable manufacturing method in the atmospheric environment and (b) of FIG. 14 illustrates an undesirable manufacturing method in the atmospheric environment. In (a) and (b) of FIG. 14, airflow is illustrated by arrows 44. In (a) of FIG. 14, bubbles are directed in an upward Z direction from the insulating liquid resin composition due to a difference in specific gravity between the insulating liquid resin composition and the bubbles, that is, air, so that the bubbles go out into the atmosphere. Therefore, a probability of engulfing the air is decreased. On the other hand, in (b) of FIG. 14, air moving upward, that is, in Z direction is blocked by the S surface of the substrate 20 and thus void 41 is prone to be formed. Use of the manufacturing method of (a) of FIG. 14 enables avoiding formation of the void 41 that is ordinarily prone to be formed on the S surface of the substrate 20 even in atmosphere and that is to be a factor of decrease in the thermal conductivity, as much as possible. Thus the resin layer may be formed without insertion of equipment into a vacuum vessel, so that workability may be greatly improved. In addition, costs related to introduction of equipment may be reduced.

In the power supply devices 100 described as to Embodiments 1 to 9, the heat dissipation paths are ensured by potting (filling, molding) between the S surface of the substrate on which the high-heat-generating component is mounted and the chassis of the power supply connected to a structure of an artificial satellite with the insulating liquid resin that is resistant to space environment and that has the high thermal conductivity and by potting (filling, molding) on the screw part to connect the substrate and the chassis with the insulating liquid resin that is resistant to the space environment and that has the high thermal conductivity.

That is, curbing increase in a temperature of the component on the substrate is enabled by provision of the paths for the heat dissipation in addition to conventional thermal paths (in in-plane directions along the substrate) that depend on copper foil forming the circuit pattern in the substrate and by resultant increase in capability for the heat dissipation to the chassis that is a casing of the power supply.

DESCRIPTION ON EFFECTS OF EMBODIMENTS

The heat dissipation paths are ensured by the potting (filling, molding) around the high-heat-generating component or between the substrate on which the component is mounted and the chassis with the insulating liquid resin that is resistant to the space environment and that has the high thermal conductivity. In addition to the conventional thermal paths (in the in-plane directions along the substrate) made of the circuit pattern formed of the copper foil ordinarily between tens of μm and several hundred μm, the paths for the heat dissipation are provided by connection between the substrate and the chassis through the resin having the high thermal conductivity. The paths for the heat dissipation increase the capability for the heat dissipation in the chassis direction that is an off-plane direction from the substrate. Thus curbing the increase in the temperature of the component on the substrate is enabled.

The insulating liquid resin having the high thermal conductivity contains at least one of alumina, boron nitride, aluminum nitride, magnesium oxide, and beryllium oxide, as the inorganic filler providing the high thermal conductivity.

The hardness of the cured insulating liquid resin is 70 or less (Shore A).

The cured insulating liquid resin has the low-molecular component volatilization volume of 500 ppm or less in 300° C. heating and has the glass transition point of −20° C. or lower. In the cured insulating liquid resin, as described above, silicone or urethane is the base resin.

The configuration in which radiation paths are ensured by the thermally conductive potting rein enables curbing increase in temperatures of electric components such as FET elements and enables decrease in sizes or increase in power of the power supply. Thus a structure with high heat dissipation that allows mounting of high-heat-generating components even with use of conventional substrates such as polyimide substrates or glass epoxy substrates may be provided.

Embodiment 10

With reference to FIGS. 15 to 20, Embodiment 10 will be described. In relation to Embodiment 10, power supply devices 101-1, 101-2, 102-1, 102-2, 102-3, and 102-4 will be described. Embodiment 10 relates to the power supply devices in which a potential at a ground terminal 25a of the electric component 25 and a potential on the chassis 10 are kept at different potentials and in which the heat of the electric component 25 is conducted to the chassis 10. In the power supply devices of Embodiment 10, the chassis 10 includes a raised part.

Figure 15:
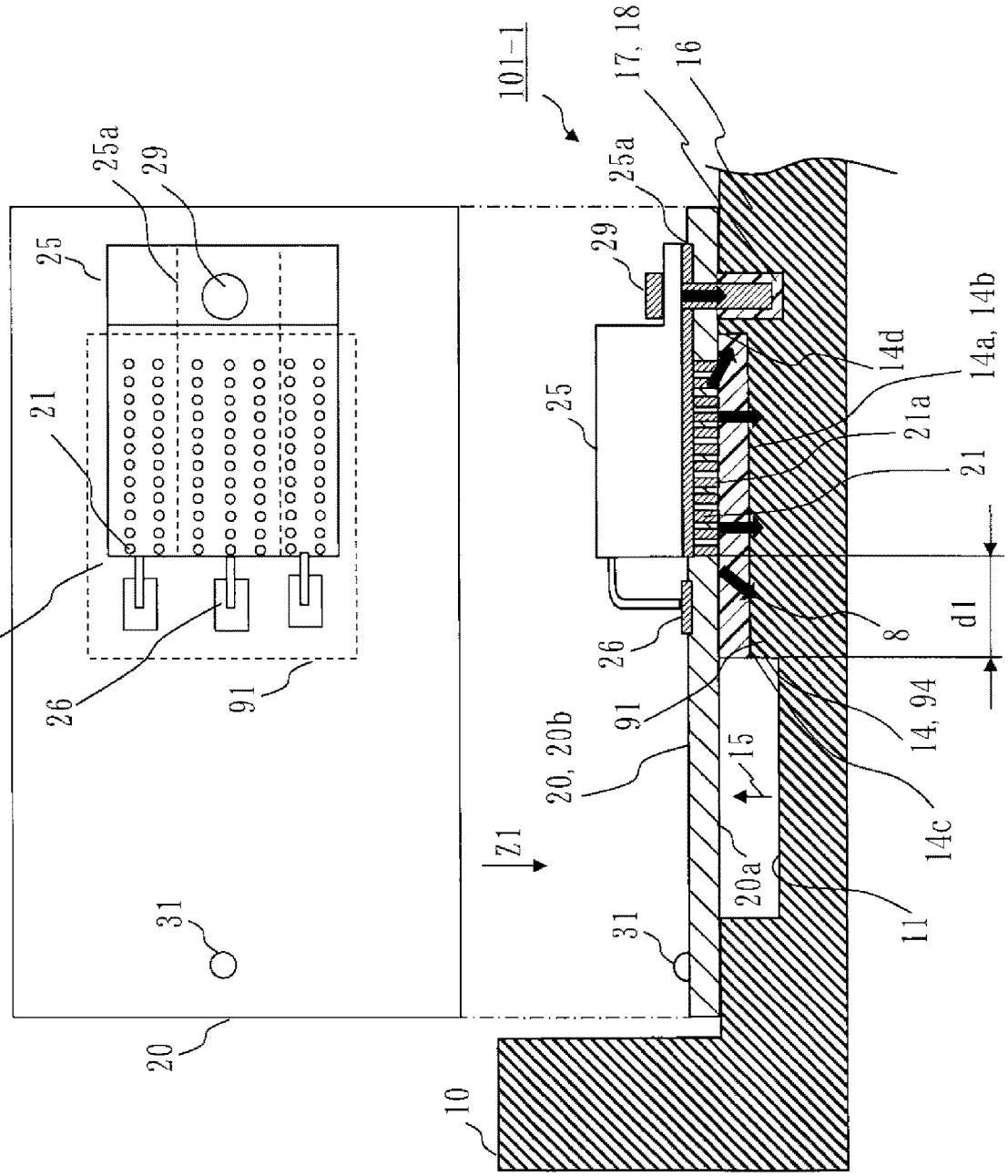
FIG. 15 is a diagram illustrating Embodiment 10 and a sectional view of a power supply device 101-1.

FIG. 15 illustrates a plan view and a sectional view of the power supply device 101-1. An upper drawing in FIG. 15 schematically illustrates the plan view of the power supply device 101-1 as seen looking in Z1 direction. In the upper drawing in FIG. 15, the filled through-holes 21 are illustrated by solid lines. With reference to FIG. 15, the power supply device 101-1 of Embodiment 10 will be described.

The power supply device 101-1 includes the chassis 10, the substrate 20, and the chassis-side resin part 91.

Hereinbelow, the one surface 20a and the other surface 20b of the substrate 20 will be referred to as the surface 20a and the surface 20b.

The electric component 25 is mounted on the substrate 20. The chassis 10 includes the chassis surface 11 that is the surface facing the surface 20a of the substrate 20 and the raised part 14 which is raised from the chassis surface 11 toward the surface 20a and whose end part 14a with respect to a raising direction 15 faces the surface 20a without contact with the surface 20a. The raised part 14 is a heat transfer part 94. Heat generated in the electric component 25 is conducted to the raised part 14. The chassis-side resin part 91 is placed between the surface 20a of the substrate 20 and the end part 14a of the raised part 14 and is connected to the surface 20a and the end part 14a. The chassis-side resin part 91 is cured insulating resin having a thermal conductivity between 1 W/mK and 10 W/mK inclusive.

As illustrated in FIG. 15, the substrate 20 includes the filled through-holes 21 in which the through-holes penetrating from the surface 20a to the surface 20b are filled with heat transfer material. The chassis-side resin part 91 is connected to the one end part 21a of each of the filled through-holes 21 that appears on the surface 20a and to the end part 140 of the raised part 14. The heat transfer material in the filled through-holes 21 is either metal or the cured insulating resin having the thermal conductivity between 1 W/mK and 10 W/mK inclusive.

In FIG. 15, the chassis 10 includes an installation part 16 and the raised part 14 that is the heat transfer part 94. The ground terminal 25a of the electric component 25, together with the electric component 25, is fixed to the installation part 16 by the fixation screw 29. The ground terminal 25a is thermally connected to the filled through-holes 21. The chassis 10 includes an insulating body 17 and the electric component 25 is fixed to the insulating body 17 by the fixation screw 29. Specifically, the fixation screw 29 engages with internal threads 18 formed in the insulating body 17 embedded in the chassis 10. As illustrated in FIG. 15, the filled through-holes 21 are not in contact with the fixation screw 29.

In the raised part 14, an end surface 14b of the end part 14a protrudes from the chassis surface 11 so as to be adjacent to the surface 20a of the substrate 20. The chassis-side resin part 91 is filled into between the end surface 14b of the raised part 14 and the surface 20a of the substrate 20. The chassis-side resin part 91 is thermally connected to the filled through-holes 21 thermally connected to the electric component 25.

The filled through-holes 21 are surrounded by a nonconductive region 20c of the substrate 20. The nonconductive region 20c is a region having no electrical conductivity in the substrate 20. As illustrated in FIG. 15, a creepage distance d1 of the nonconductive region 20c has a length equal to or longer than a specified distance d from the ground terminal 25a. Specifically, the creepage distance d1 along the surface 20a between an end of the ground terminal 25a and a side surface 14c of the raised part 14 has the length equal to or longer than the specified distance d. Installation of the electric component 25 of high voltage on the substrate 20 is enabled by the creepage distance d1 that is equal to or longer than the specified distance d. Potentials at the electrodes 26 and the ground terminal 25a of the electric component 25 differ from the potential on the chassis 10.

The power supply device 101-1 illustrated in FIG. 15 has a configuration in which the chassis-side resin part 91 is filled into between the chassis 10 provided with steps by the raised part 14 and the filled through-holes 21 provided on the substrate 20. The configuration is characterized in that the filled through-holes 21 are connected to "a side surface 14d of the raised part 14 and the end surface 14b of the raised part 14 that are wall surfaces of the steps".

The heat 8 of the electric component 25 is conducted from the filled through-holes 21 of the substrate 20 to the chassis-side resin part 91 and from the chassis-side resin part 91 to the raised part 14 of the chassis 10. In addition, the heat 8 of the electric component 25 is conducted from around the fixation screw 29 through the substrate 20 to the installation part 16.

In a power supply device having the configuration in which the through-holes formed on the substrate 20 and the chassis 10 are connected by the resin so that the heat may be dissipated unidirectionally, performance of the heat dissipation greatly depends on the thermal conductivity of the resin.

In the power supply devices of Embodiment 10, by contrast, the convex steps are provided on the chassis 10 by the raised part 14. In Embodiment 11 to be described later, a concave recess 55 is provided on the chassis 10.

By diffusion of the heat throughout the convex or concave wall surfaces through thermal diffusion in the resin, the heat dissipation paths are enhanced or the heat dissipation paths of the shortest routes are formed in the resin. The performance of the heat dissipation is improved by such heat dissipation paths and thus the power supply devices may be provided with higher heat dissipation property.

Figure 16:
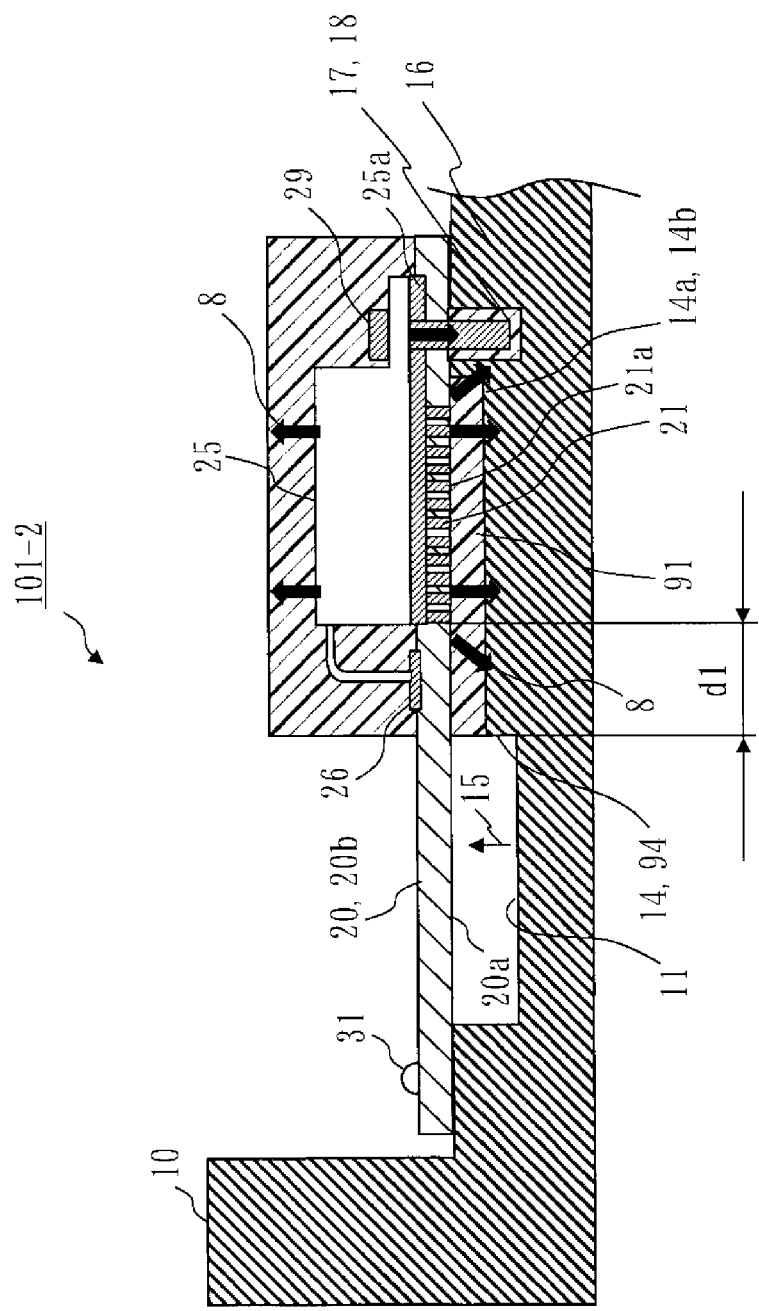
FIG. 16 is a diagram illustrating Embodiment 10 and a sectional view of a power supply device 101-2.

FIG. 16 illustrates the power supply device 101-2 that is a modification of the power supply device 101-1. In the power supply device 101-2, the electric component 25 is covered with the component-side resin part 92. There is an only difference from the power supply device 101-1 in this respect. Such a configuration in which the electric component 25 is covered with the component-side resin part 92 may be adopted.

Figure 17:
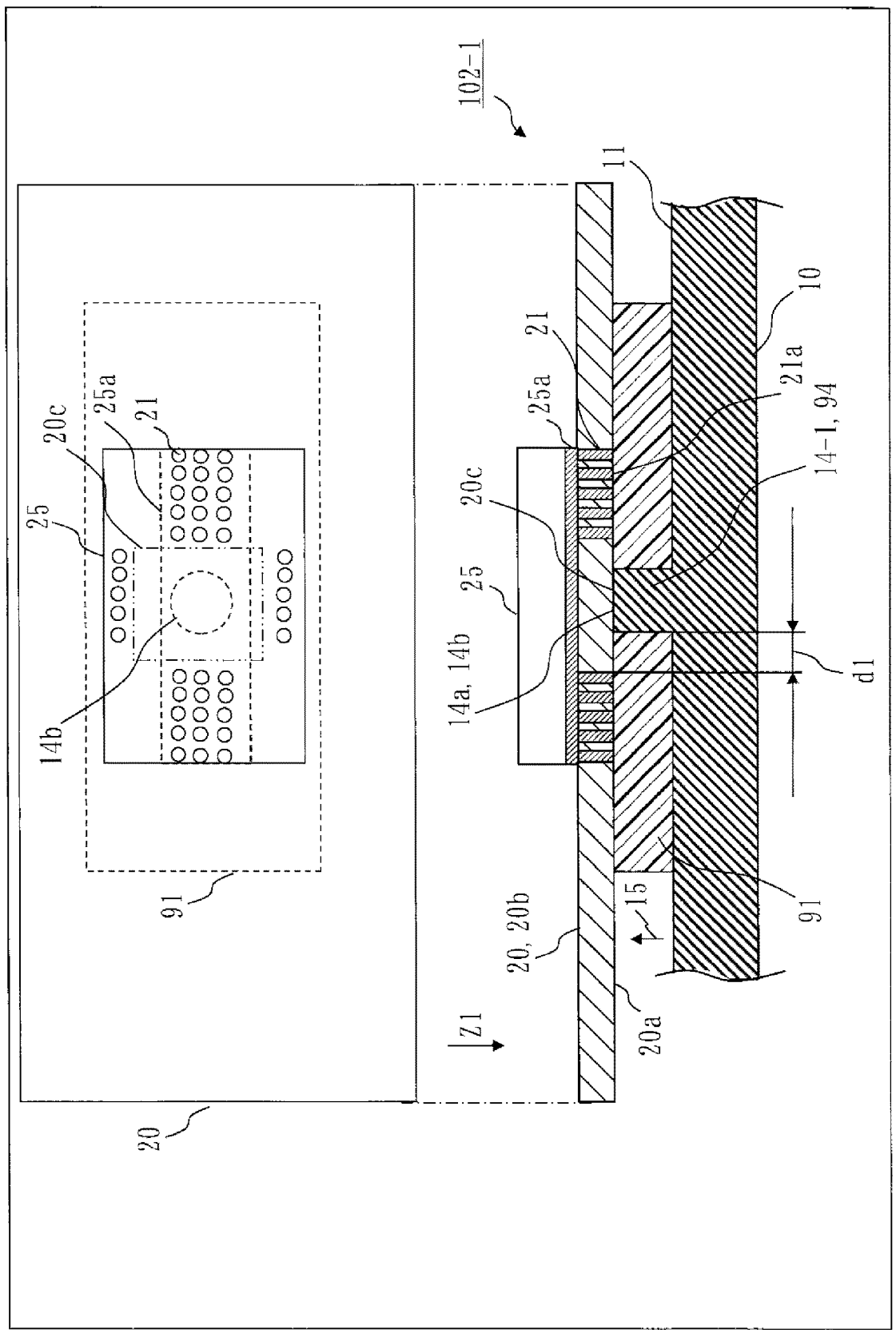
FIG. 17 is diagrams illustrating Embodiment 10 and a plan view and a sectional view of a power supply device 102-1.

FIG. 17 illustrates a plan view and a sectional view of the power supply device 102-1.

An upper drawing in FIG. 17 schematically illustrates the plan view of the power supply device 102-1 as seen looking in Z1 direction. In the upper drawing in FIG. 17, positions of an end surface 14b of a raised part 14-1 and the plurality of filled through-holes 21 are illustrated. In the upper drawing, the filled through-holes 21 are illustrated by solid lines.

The substrate 20 includes the filled through-holes 21 in which the through-holes penetrating from the surface 20a to the surface 20b are filled with heat transfer material. The raised part 14-1 is raised from the chassis surface 11 toward the surface 20a in the chassis-side resin part 91 and has the end part 14a with respect to the raising direction 15 facing the surface 20a. The chassis-side resin part 91 is connected to the one end part 21a of each of the filled through-holes 21 that appears on the surface 20a.

In FIG. 17, the end surface 14b of the raised part 14-1 is in contact with the nonconductive region 20c in the surface 20a of the substrate 20. That is, the end surface 14b of the end part 14a of the raised part 14-1 is in contact with the nonconductive region 20c. A region on the surface 20a where the one end part 21a of each of the filled through-holes 21 does not appear forms the nonconductive region 20c.

The raised part 14-1 is shaped like a column, for instance. The raised part 14-1 is shaped like a cylinder, a triangular column, a square column, or a polygonal column with five or more angles, as examples.

In FIG. 17, the plurality of filled through-holes 21 are placed around the nonconductive region 20c. As in the upper drawing in FIG. 17, the nonconductive region 20c is surrounded by the plurality of filled through-holes 21.

As illustrated in FIG. 17, the electric component 25 is placed over the plurality of filled through-holes 21. The raised part 14-1 is surrounded by the chassis-side resin part 91. Though the end surface 14b of the raised part 14-1 is in contact with the surface 20a of the substrate 20 in FIG. 17, the chassis-side resin part 91 may be filled into between the end surface 14b and the surface 20a of the substrate 20.

As illustrated in FIG. 17, the creepage distance d1 along the surface 20a between an end part of the end surface 14b of the raised part 14-1 and the filled through-hole 21 nearest thereto has a length equal to or longer than the specified distance d, as with the power supply device 101-1. The same applies to the power supply devices 102-2, 102-3, and 102-4.

Figure 18:
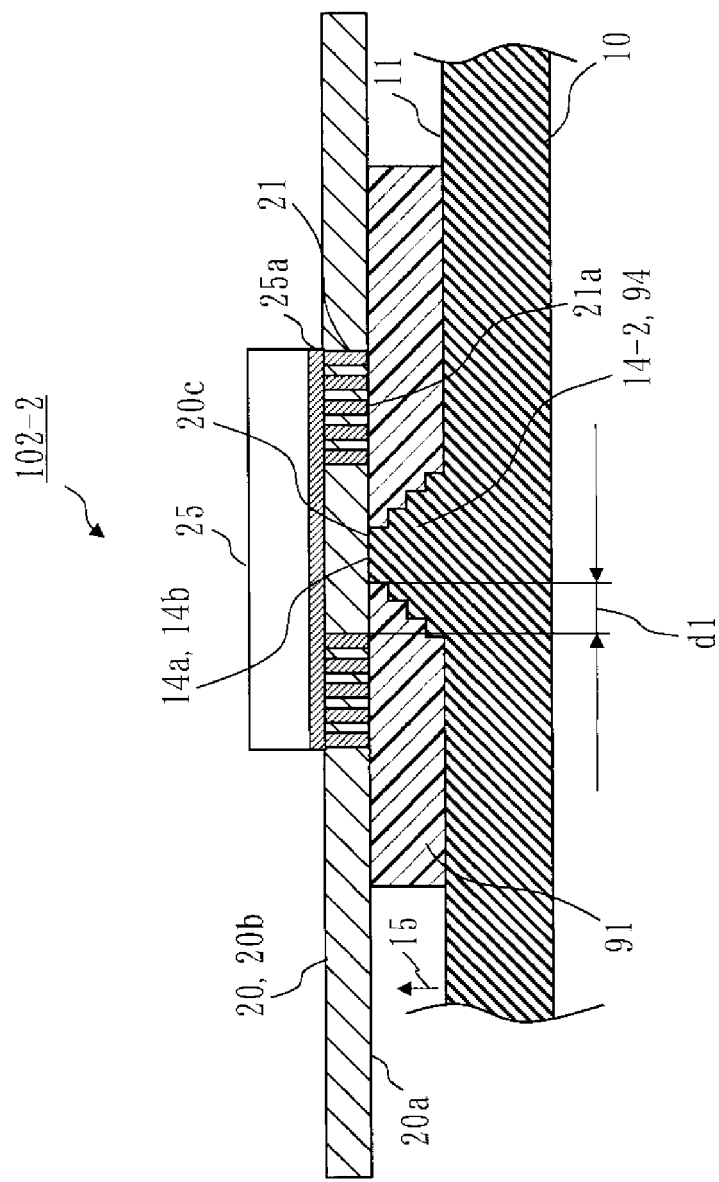
FIG. 18 is a diagram illustrating Embodiment 10 and a sectional view of a power supply device 102-2.

FIG. 18 is a sectional view of the power supply device 102-2.

Figure 19:
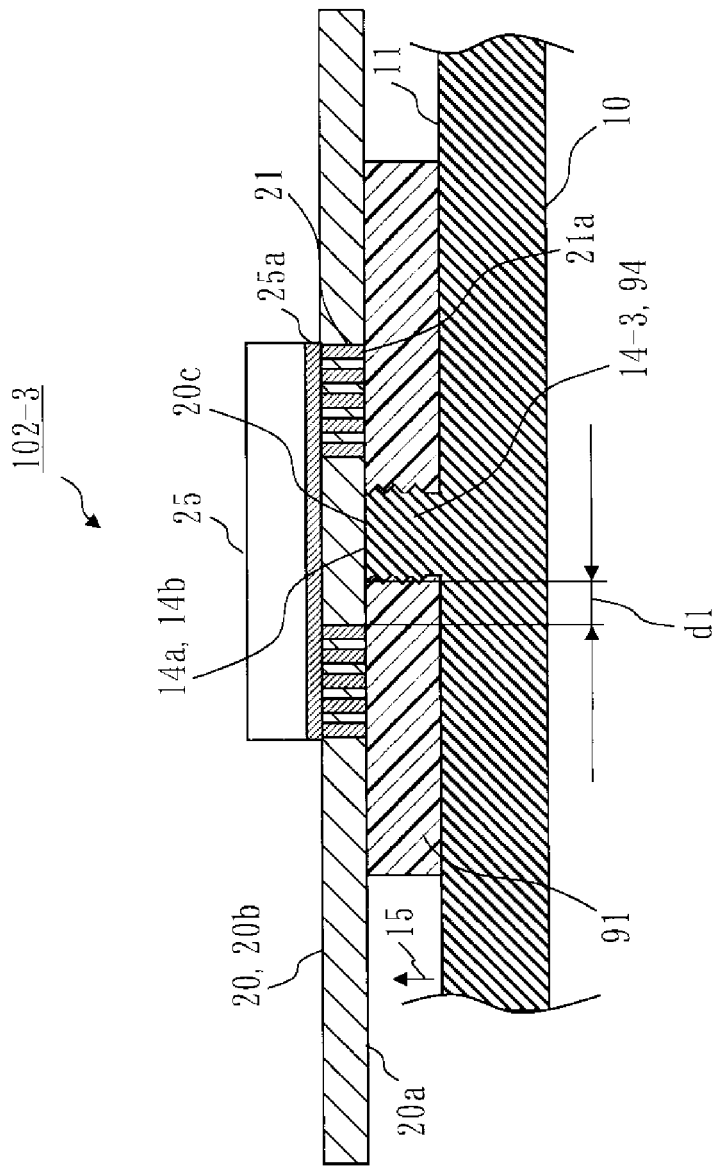
FIG. 19 is a diagram illustrating Embodiment 10 and a sectional view of a power supply device 102-3.

FIG. 19 is a sectional view of the power supply device 102-3.

Figure 20:
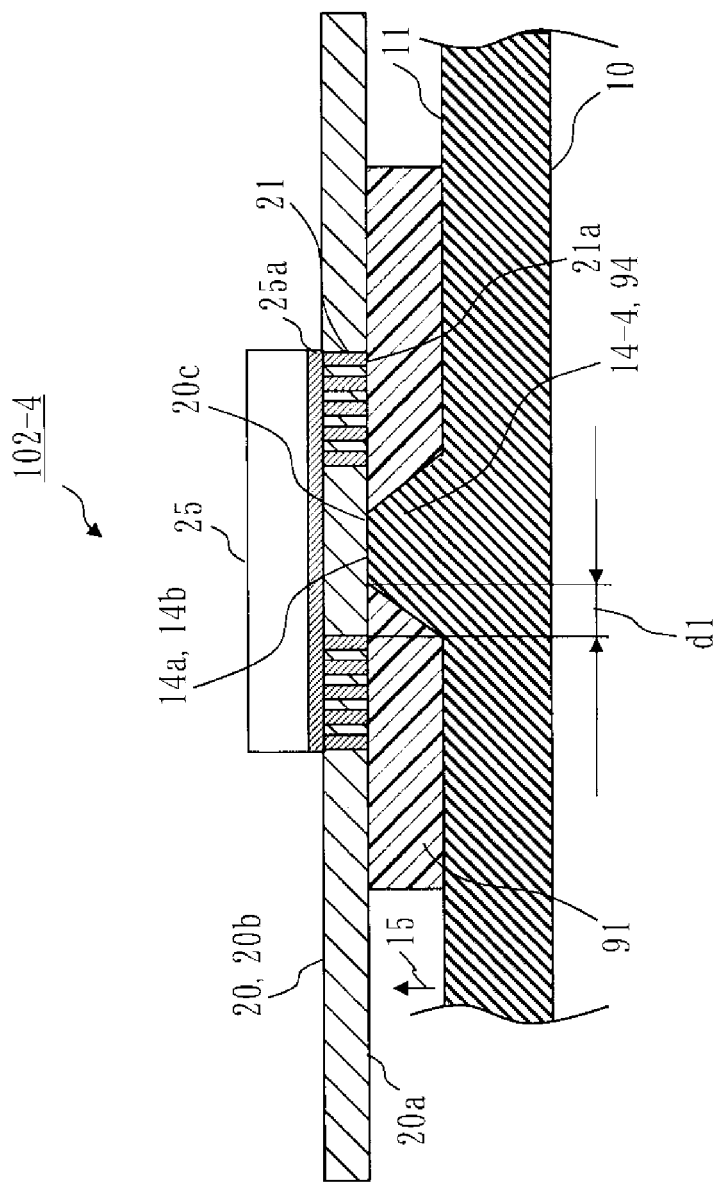
FIG. 20 is a diagram illustrating Embodiment 10 and a sectional view of a power supply device 102-4.

FIG. 20 is a sectional view of the power supply device 102-4.

The power supply device 102-2, the power supply device 102-3, and the power supply device 102-4 differ from the power supply device 102-1 in the shape of the raised part. In both of a raised part 14-2 of the power supply device 102-2 and a raised part 14-4 of the power supply device 102-4, shapes of sections taken with the raising direction 15 being a normal direction vary along the raising direction 15. In the raised part 14-2 and the raised part 14-4, sizes of the shapes of the sections gradually decrease in the raising direction 15.

In the raised part 14-2 of the power supply device 102-2, cross-sectional areas (outside diameters) are varied. In the raised part 14-2 of the power supply device 102-2, the cross-sectional areas are decreased stepwise from the chassis surface 11 toward the surface 20a of the substrate 20. The raised part 14-2 of the power supply device 102-2 is shaped like a plurality of cylinders that differ in outside diameter and that are built up in descending orders of the outside diameter from the chassis surface 11 toward the surface 20a of the substrate 20.

In the raised part 14-3 of the power supply device 102-3, the outside diameters of the cross-sectional areas vary while alternating between a long diameter and a short diameter from the chassis surface 11 toward the surface 20a.

The raised part 14-3 is spirally shaped or has wedged longitudinal sections and has perimeters forming an uneven shape, for instance.

In the raised part 14-4 of the power supply device 102-4, the cross-sectional areas are decreased gently or continuously from the chassis surface 11 toward the surface 20a of the substrate 20. The raised part 14-4 is shaped like a truncated cone or a truncated polygonal pyramid, for instance.

DESCRIPTION ON EFFECTS OF EMBODIMENT 10

In the power supply device 101-1 and the power supply device 101-2, the chassis-side resin part 91 connects the end surface 14b of the raised part 14 and the surface 20a. The creepage distance d1 has the length equal to or longer than the specified distance d. According to the power supply device 101-1 and the power supply device 101-2, consequently, the potential at the ground terminal 25a and the potential on the chassis 10 may be kept at different potentials and the heat of the electric component 25 may be conducted to the chassis 10.

In the power supply device 102-1 to the power supply device 102-4, the end surface 14b of the raised part 14 is in contact with the surface 20a. The chassis-side resin part 91 connects the end surface 14b of the raised part and the surface 20a. In addition, the creepage distance d1 has the length equal to or longer than the specified distance d. According to the power supply device 102-1 to the power supply device 102-4, consequently, the potential at the ground terminal 25a and the potential on the chassis 10 may be kept at different potentials and the heat of the electric component 25 may be conducted to the chassis 10.

Embodiment 11

Figure 21:
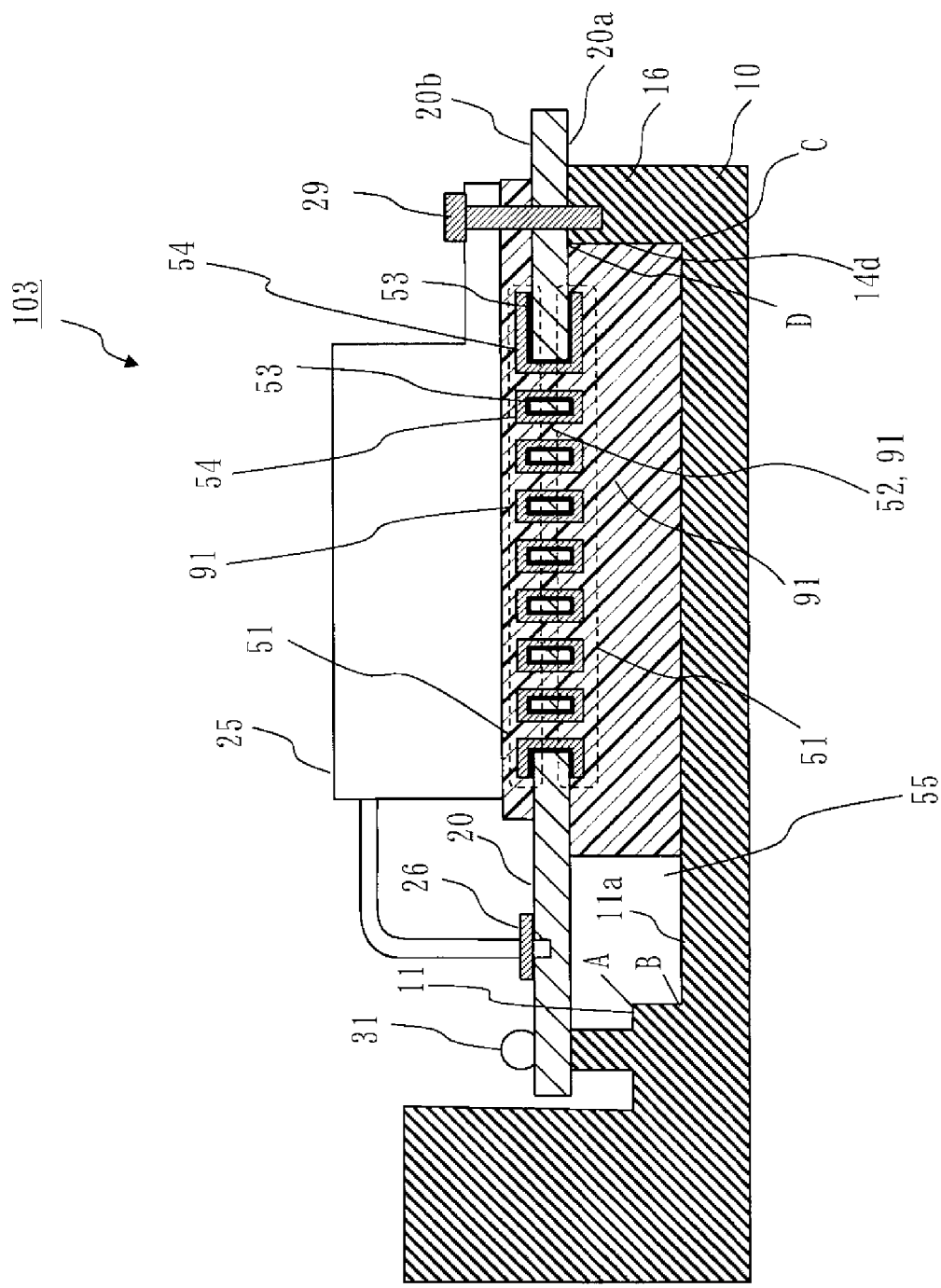
FIG. 21 is a diagram illustrating Embodiment 11 and a sectional view of a power supply device 103.

FIG. 21 is a diagram illustrating a power supply device 103 according to Embodiment 11. In the power supply device 103, steps are provided on the chassis surface 11, so that the concave recess 55 exists. In FIG. 21, the recess 55 is represented by corners A to D. The recess 55 has a bottom surface 11a lower than the chassis surface 11.

The power supply device 103 includes the electric component 25, the substrate 20, the chassis 10 having the chassis surface 11 facing the surface 20a of the substrate 20, and the chassis-side resin part 91. The substrate 20 includes a solder leveler formation region 51 in which solder leveler 54 is formed in a region to be covered with the electric component 25 on the surface 20b that is on the back side of the surface 20a and includes a solder leveler formation region 51 in which the solder leveler 54 is formed on the surface 20a. The substrate 20 includes a plurality of through-holes 52 formed through the substrate 20 from the surface 20a to the surface 20b, in which the solder leveler 54 is formed in an inside surfaces, and which are placed in the region to be covered with the electric component 25.

The chassis-side resin part 91 is placed between the electric component 25 and the solder leveler formation region 51 formed on the surface 20b of the substrate 20, between the solder leveler formation region 51 formed on the surface 20a of the substrate 20 and the chassis 10, and inside the through-holes 52.

The chassis-side resin part 91 has a thermal conductivity between 1 W/mK and 10 W/mK inclusive and has a hardness of 70 or less on a Shore A scleroscope. The chassis-side resin part 91 is cured insulating resin.

As illustrated in FIG. 21, solder leveler 52a formed in the through-holes 52 is connected to the solder leveler formation region 51 formed on the surface 20a and the solder leveler formation region 51 formed on the surface 20b.

As illustrated in FIG. 21, the power supply device 103 is characterized in that the chassis-side resin part 91 that is the cured resin is placed in sites to be described as (1), (2), and (3) below, as described above. The chassis-side resin part 91 therein has the thermal conductivity between 1 W/mK and 10 W/mK inclusive and has the hardness of 70 or less on the Shore A scleroscope. The chassis-side resin part 91 is the cured insulating resin.

(1) The chassis-side resin part 91 is placed between the electric component 25 and the solder leveler formation region 51 formed on the surface 20b of the substrate 20. In the solder leveler formation region 51, the solder leveler 54 is formed on a surface of copper plating 53 applied on the surface 20b of the substrate 20.

(2) The chassis-side resin part 91 is placed between the solder leveler formation region 51 formed on the surface 20a of the substrate 20 and the chassis 10.

(3) The chassis-side resin part 91 is placed inside the through-holes 52 formed in the region of the substrate 20 directly beneath the electric component 25.

Therein, the copper plating 53 is applied on the inside surfaces of the through-holes 52 and the solder leveler 54 is applied on surfaces of the copper plating 53.

The inside of the through-holes 52 has a laminated structure made of the copper plating 53 and the solder leveler 54.

In the power supply device 103, paths for heat dissipation extending from the heat-generating electric component 25 to the chassis 10 are formed of the chassis-side resin part 91 that is the resin.

With use of the resin having a low hardness, stresses generated due to thermal shock and vibrations may be absorbed or relaxed by the resin.

Thus separation of each of the electric component 25, the substrate 20, the through-holes 52, and the chassis 10 from resin interfaces on the chassis-side resin part 91 may be reduced, so that reliability for the heat dissipation may be increased.

By interposition of the chassis-side resin part 91 having the low hardness between the electric component 25 and the substrate 20, adhesion between the electric component 25 and the substrate 20 may be increased and interfacial thermal resistance may be reduced.

It is desirable that a thickness of the chassis-side resin part 91 that is the cured resin provided between the electric component 25 and the substrate 20 should be small, for decrease in the thermal resistance, and the thickness of the chassis-side resin part 91 is preferably equal to or lower than 0.25 mm.

The electric component 25 may be any of a resin molding, a ceramic package product, and a configuration covered with a metal case.

<Modification 1>

As the chassis-side resin part 91 illustrated in FIG. 21, a liquid resin composition having a viscosity between 10 Pa·s and 300 Pa·s inclusive may be used.

The bottom surface 11a of the chassis 10 or the surface 20b of the substrate 20 is coated with the liquid resin composition having the high viscosity equal to or higher than 10 Pa·s with a thickness greater than a conventional thickness.

The liquid resin composition having the high viscosity as coating is filled into the inside of the through-holes 52 by a pressure generated when the substrate 20 is fixed to the chassis 10 by the substrate fixation screw 31 or when the electric component 25 is fixed to the substrate 20 by the fixation screw 29.

The viscosity of the liquid resin composition having the high viscosity equal to or higher than 10 Pa·s is between 10 Pa·s and 300 Pa·s inclusive, as described above.

More preferably, the viscosity of the liquid resin composition is between 50 Pa·s and 150 Pa·s because difficulty in fixation by the screw is increased with increase in the viscosity of the liquid resin composition.

Even the resin having the viscosity equal to or higher than 10 Pa·s is filled into the through-holes 52 during the coating.

The resin, however, may flow out of the through-holes 52 due to decrease in the viscosity when the resin is cured. In that case, the resin, if curable by heat, is semi-cured by being heated to a low temperature and is thereafter cured at a curing temperature higher than the temperature for semi-curing. Thus outflow from the through-holes 52 may be remedied.

On condition that the viscosity of the liquid resin composition is lower than 10 Pa·s, there is a fear that decrease in the viscosity during the curing of the resin may prevent the resin from remaining inside the through-holes 52 so as to cause occurrence of unfilled regions or so as to make void remain inside the through-holes 52 after the curing of the resin. In those cases, it is necessary to provide a wall that is to dam the resin so as to prevent the resin from flowing.

<Modification 2>

The cured resin may be formed of the same resin. The term "the same" in "the same resin" means that physical properties of the resin are considered the same.

That is, in case where
(1) a space between the electric component 25 and the solder leveler formation region 51 on the substrate 20,
(2) a space between the solder leveler formation region 51 formed on the surface 20a of the substrate 20 and the chassis 10, and
(3) the inside of the through-holes 52 of the substrate 20 provided directly beneath the electric component 25
are filled with different resins, there is a fear that separation on interfaces between the cured materials may be caused by thermal shock because of difference in the physical properties such as hardness and coefficient of thermal expansion among the cured resins. Problems such as the separation may be avoided by filling of resins having the same physical properties.

Though Embodiment 1 to Embodiment 11 have been described above, those embodiments relate to the power supply devices 100 and two or more out of the embodiments may be combined. Alternatively, one of the embodiments may be partially embodied. Alternatively, two or more out of the embodiments may be partially embodied in combination. Note that the present invention is not to be limited by those embodiments but may be modified in various manners as appropriate.

REFERENCE SIGNS LIST

8: heat; 10: chassis; 11: chassis surface; 11a: bottom surface; 12: screw hole; 13: area; 14, 14-1, 14-2, 14-3, 14-4: raised part; 14a: end part; 14h: end surface; 14c: side surface; 15: raising direction; 16: installation part; 17: insulating body; 18: internal thread; 20: substrate; 20a: one surface; 20h: the other surface; 20c: nonconductive region; 21: filled through-hole; 21a: one end part; 21b: the other end part; 23: thermally-conductive material; 24: adhesive; 25: electric component; 25a: ground terminal; 26: electrode; 29: fixation screw; 27-1: cured insulating resin; 27-2: resin; 27-3, 27-4: cured resin; 28-1: electrode connection part; 28-2: chassis connection part; 28-3: through-hole connection part; 29: fixation screw; 30: fixation part; 31: substrate fixation screw; 32a: solder; 32b: screw; 33: spring fixture; 41: void; 42: screw; 51: solder leveler formation region; 52: through-hole; 53: copper plating; 54: solder leveler; 55: recess; 91: chassis-side resin part; 92: component-side resin part; 93: contact resin part; 94: heat transfer part; 100, 100-1, 100-2, 100-3, 100-4, 100-5, 100-6, 100-7, 100-8, 101-1, 101-2, 102-1, 102-2, 102-3, 102-4, 103: power supply device

The invention claimed is:

1. A power supply device comprising: a substrate on which an electric component is mounted; a chassis including a chassis surface to be a surface facing one surface of the substrate; and a chassis-side resin part to be a cured insulating resin to be placed between the one surface of the substrate and the chassis surface so as to be connected to the one surface and the chassis surface, the cured insulating resin having a thermal conductivity between 1 W/mK and 10 W/mK inclusive, wherein the chassis includes a raised part raised from the chassis surface toward the one surface in a state of being in contact with the chassis-side resin part and including an end part with respect to a raising direction being in contact with the one surface, and the electric component is placed on the other surface that is on a back side of the one surface so that the substrate is interposed between the electric component and an end surface of the end part of the raised part, wherein the electric component has a potential differing from a potential of the chassis, the substrate includes a plurality of filled through-holes that are formed through the substrate from the one surface to the other surface, the plurality of filled through-holes being filled with a heat transfer material, wherein one end part of the heat transfer material appears on the one surface, and the other end part of the heat transfer material appears on the other surface, the other end part of each of the plurality of filled through-holes appearing on the other surface is covered with the electric component, the chassis-side resin part is connected to the one end part of each of the filled through-holes appearing on the one surface, the end surface of the end part of the raised part is in contact with a nonconductive region that is a region in the one surface where the one end part of each of the filled through-holes does not appear and that is a region where the substrate has no electrical conductivity, and an electrical potential of the raised part and an electrical potential of the plurality of filled through-holes are kept at different electrical potentials.

2. The power supply device according to claim 1, wherein the raised part has a cross-section having a normal direction that is identical to the raising direction and having a shape that varies along the raising direction.

3. The power supply device according to claim 2, wherein sizes of the shapes of the sections of the raised part gradually decrease in the raising direction.

4. The power supply device according to claim 1, wherein shapes of sections of the raised part taken with the raising direction being a normal direction vary along the raising direction.

5. The power supply device according to claim 4, wherein sizes of the shapes of the sections of the raised part gradually decrease in the raising direction.

\* \* \* \* \*